(12) United States Patent
Tessariol et al.

(10) Patent No.: US 8,384,148 B2
(45) Date of Patent: Feb. 26, 2013

(54) METHOD OF MAKING A FLOATING GATE NON-VOLATILE MOS SEMICONDUCTOR MEMORY DEVICE WITH IMPROVED CAPACITIVE COUPLING

(75) Inventors: Paolo Tessariol, Montebelluna (IT); Roberto Bez, Milan (IT); Marcello Mariani, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 334 days.

(21) Appl. No.: 11/317,679

(22) Filed: Dec. 22, 2005

(65) Prior Publication Data
US 2006/0205136 A1    Sep. 14, 2006

(30) Foreign Application Priority Data

Dec. 22, 2004   (EP) ..................................... 04425936
Dec. 22, 2004   (EP) ..................................... 04425937

(51) Int. Cl.
*H01L 29/788*   (2006.01)
(52) U.S. Cl. ..................... 257/316; 257/315; 257/E29.3
(58) Field of Classification Search .......... 257/314–326, 257/E29.3, E29.304; 365/185.01–185.33; 438/201, 211

See application file for complete search history.

(56) References Cited

U.S. PATENT DOCUMENTS

| | | | |
|---|---|---|---|
| 5,739,566 A | 4/1998 | Ota | |
| 5,770,501 A | 6/1998 | Hong | |
| 5,915,177 A | 6/1999 | Tseng | |
| 6,037,605 A | 3/2000 | Yoshimura | |
| 6,153,472 A | 11/2000 | Ding et al. | |
| 6,200,865 B1 | 3/2001 | Gardner et al. | |
| 6,323,516 B1 * | 11/2001 | Wang et al. | 257/317 |
| 6,391,722 B1 | 5/2002 | Koh | |
| 6,420,249 B1 | 7/2002 | Doan et al. | |
| 6,495,467 B2 * | 12/2002 | Shin et al. | 438/706 |
| 6,498,064 B2 | 12/2002 | Tseng | |
| 6,713,834 B2 * | 3/2004 | Mori et al. | 257/510 |
| 2001/0014503 A1 | 8/2001 | Iguchi et al. | |

(Continued)

FOREIGN PATENT DOCUMENTS

| | | |
|---|---|---|
| EP | 1091392 | 4/2001 |
| EP | 1675108 | 12/2009 |

(Continued)

OTHER PUBLICATIONS

European Search Report, EP 04 42 5936 (Parent Case).

(Continued)

*Primary Examiner* — Steven J Fulk
*Assistant Examiner* — Eric Ward
(74) *Attorney, Agent, or Firm* — Schwegman, Lundberg & Woessner, P.A.

(57) ABSTRACT

A method of making a non-volatile MOS semiconductor memory device includes a formation step, in a semiconductor material substrate, of STI isolation regions (shallow trench isolation) filled by field oxide and of memory cells separated each other by said STI isolation regions. The memory cells include a gate electrode electrically isolated from said semiconductor material substrate by a first dielectric layer, and the gate electrode includes a floating gate self-aligned to the STI isolation regions. The method includes a formation phase of said floating gate exhibiting a substantially saddle shape including a concavity; the formation step of said floating gate includes a deposition step of a first conformal conductor material layer.

11 Claims, 19 Drawing Sheets

U.S. PATENT DOCUMENTS

| | | |
|---|---|---|
| 2002/0052079 A1 | 5/2002 | Wen |
| 2002/0093073 A1 | 7/2002 | Mori et al. |
| 2002/0160570 A1 | 10/2002 | Tseng |
| 2002/0195646 A1 | 12/2002 | Tseng |
| 2003/0077907 A1 | 4/2003 | Kao et al. |
| 2003/0160273 A1* | 8/2003 | Hieda .......................... 257/303 |
| 2003/0203594 A1 | 10/2003 | Shimizu et al. |
| 2004/0061173 A1 | 4/2004 | Hu et al. |
| 2004/0080020 A1 | 4/2004 | Mori et al. |
| 2004/0126982 A1* | 7/2004 | Park .............................. 438/396 |
| 2006/0024885 A1* | 2/2006 | Sandhu et al. ................ 438/257 |

FOREIGN PATENT DOCUMENTS

| | | |
|---|---|---|
| WO | WO00/51188 | 8/2000 |

OTHER PUBLICATIONS

EP Office Action from European Patent Application No. 04425937.0-1235 dated Jan. 14, 2009; 4 pgs.

EP Office Action from European Patent Application No. 04425936.4-1235 dated Jan. 14, 2009; 4 pgs.

Non-Final Office Action from U.S. Appl. No. 11/317,641, Mailed Jun. 10, 2009, 6 pages.

Final Office Action from U.S. Appl. No. 11/317,641 mailed Dec. 29, 2009, 9 pgs.

Final Office Action from U.S. Appl. No. 11/317,641 mailed Jan. 7, 2009, 13 pgs.

Office Action from U.S. Appl. No. 11/317,641 mailed Mar. 10, 2008, 14 pgs.

European Search Report from EP04425937 mailed May 30, 2005, 9 pgs.

Examination Report from EP04425936.4 mailed Jan. 14, 2009, 4 pgs.

Examination Report from EP04425937.2 mailed Jan. 14, 2009, 4 pgs.

Office Action from EP Patent Application No. 04425937.2 mailed Jun. 14, 2010, 6 pgs.

"European Application Serial No. 04425937.2, Office Action mailed Jan. 14, 2009", 4 pgs.

"European Application Serial No. 04425937.2, Office Action mailed Jun. 14, 2010", 6 pgs.

"European Application Serial No. 04425937.2, Response filed May 18, 2009 to Office Action mailed Jan. 14, 2009", 18 pgs.

* cited by examiner

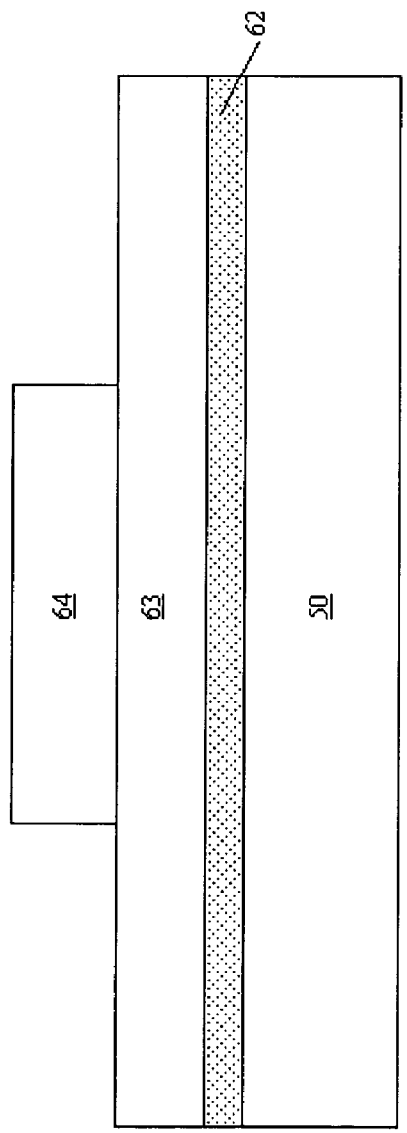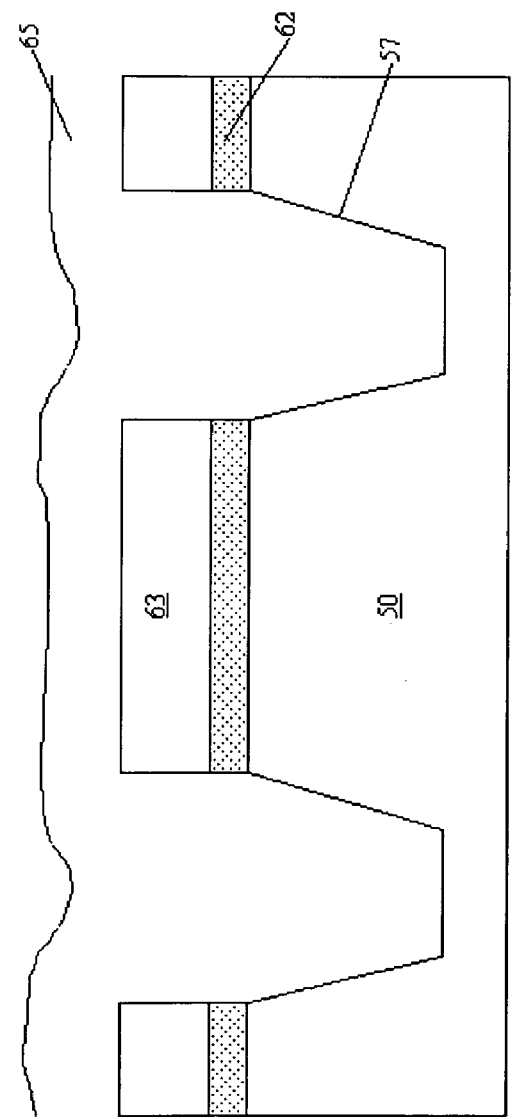

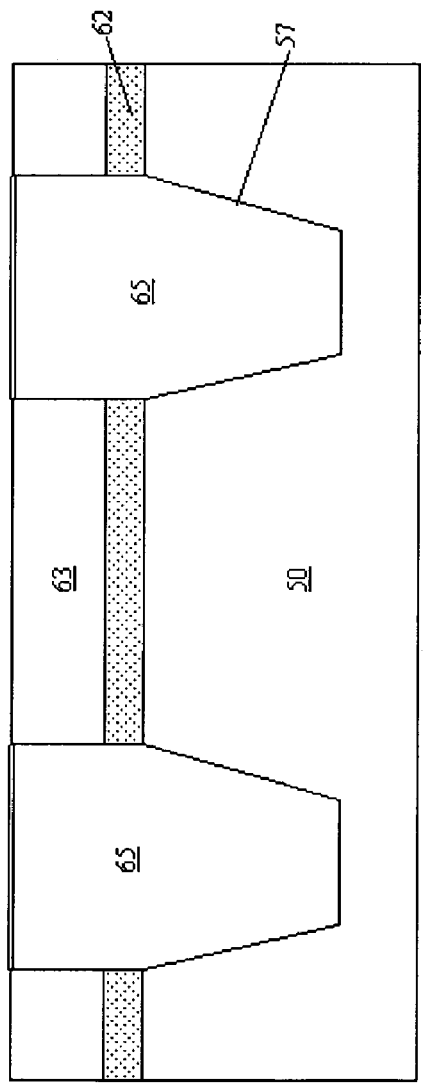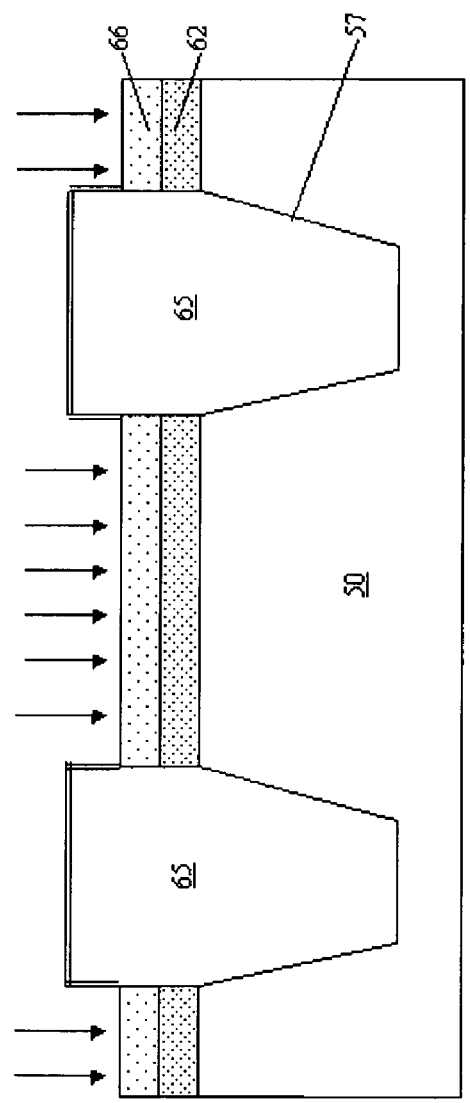

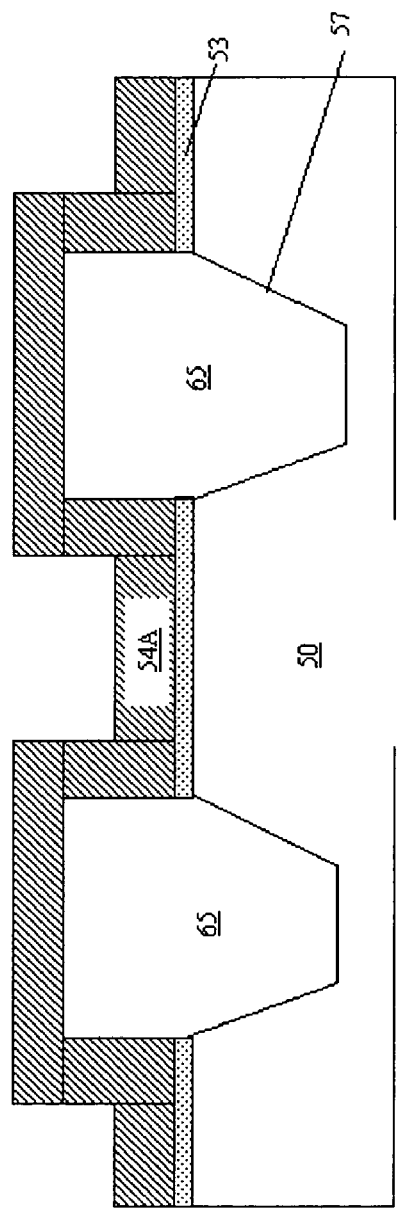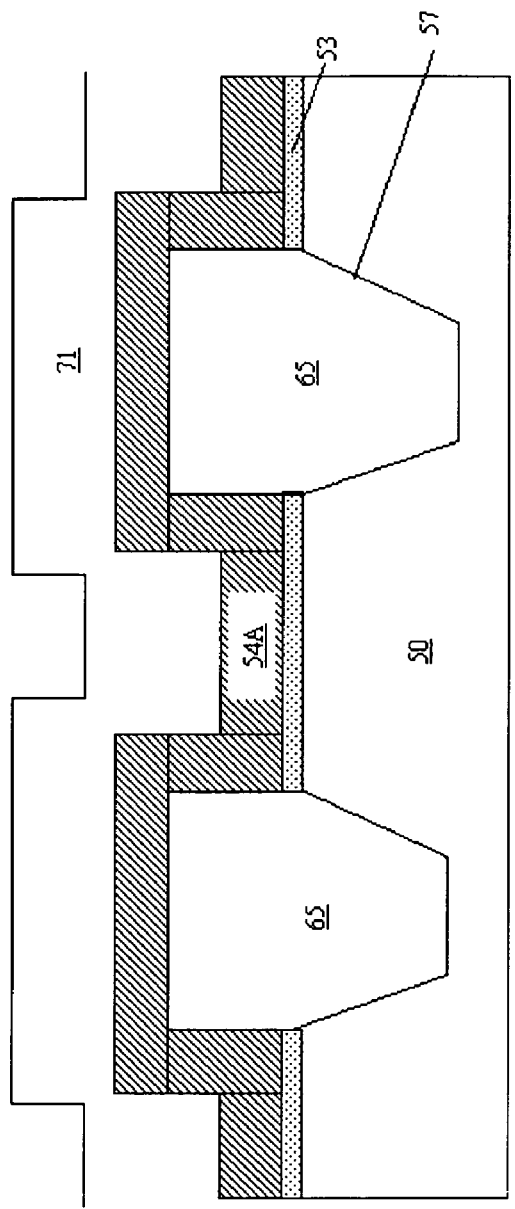

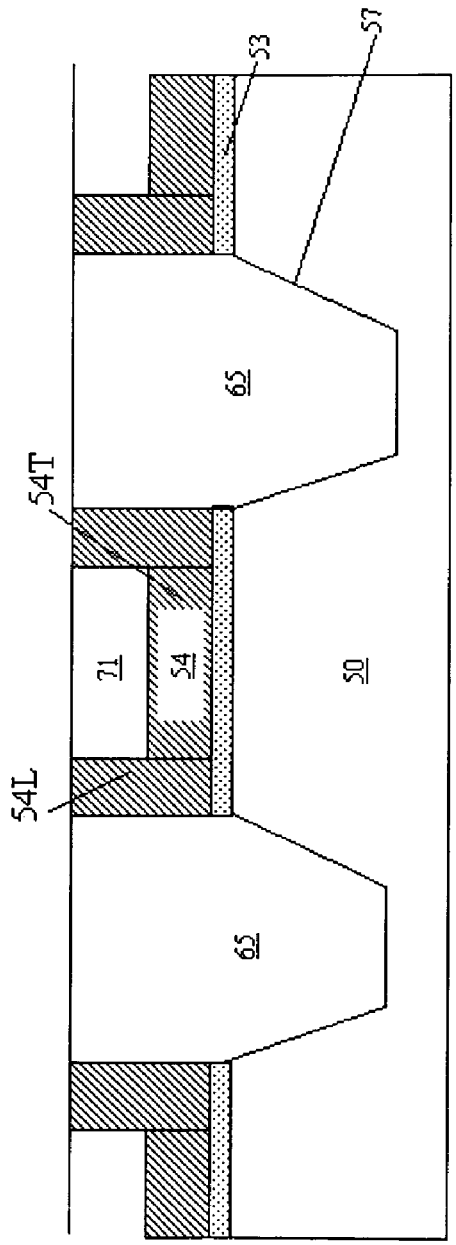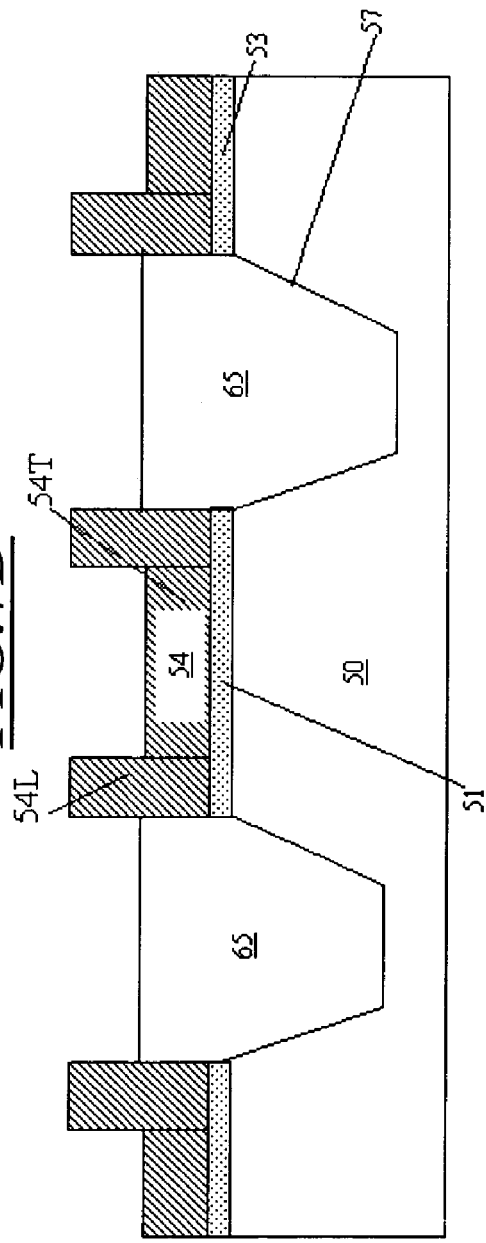

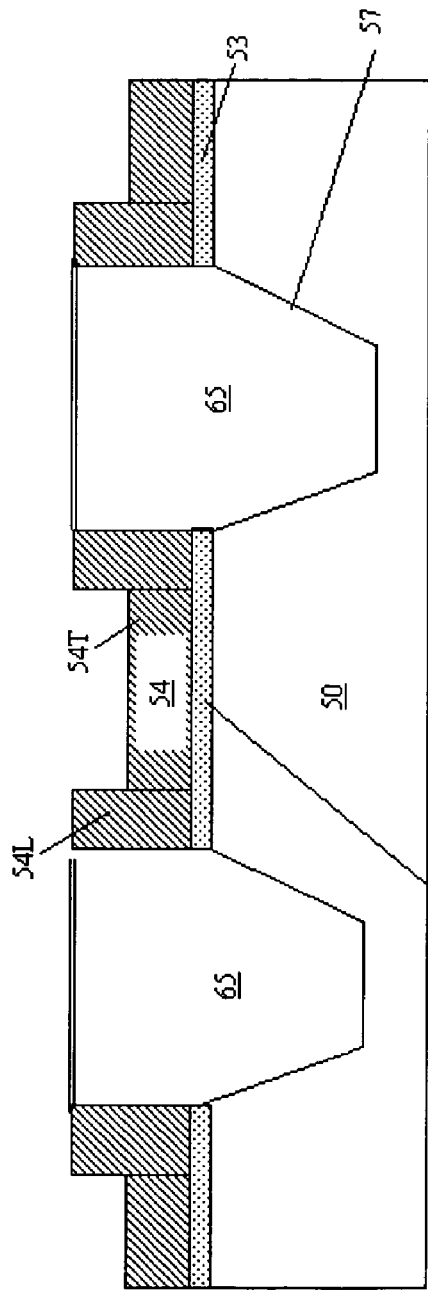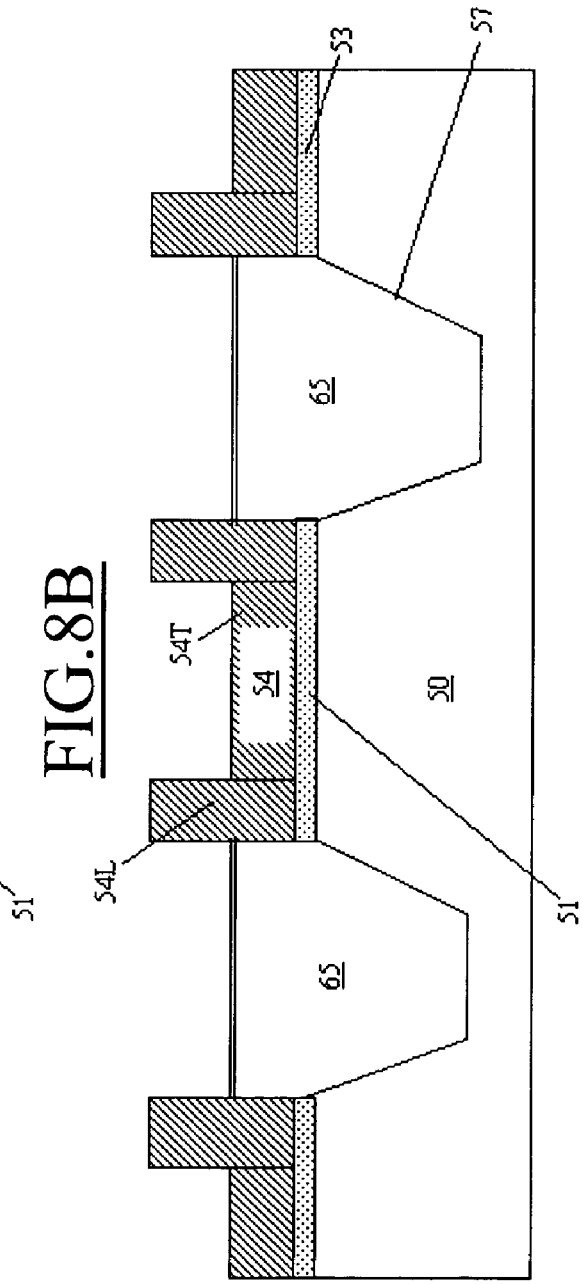

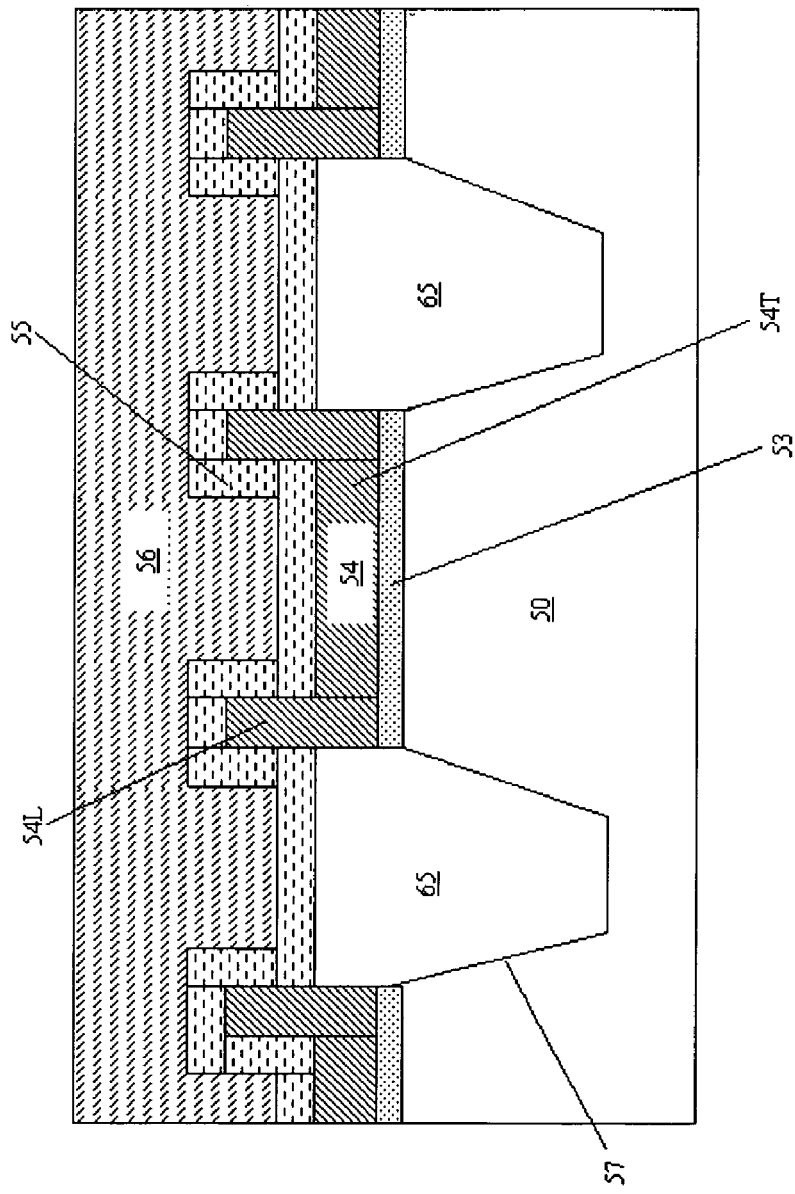

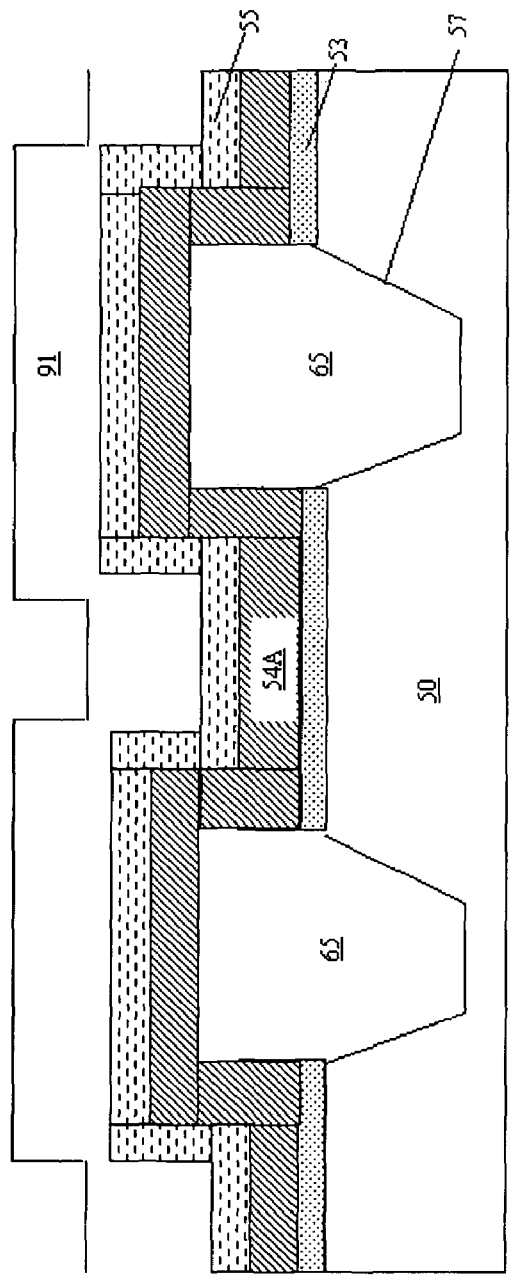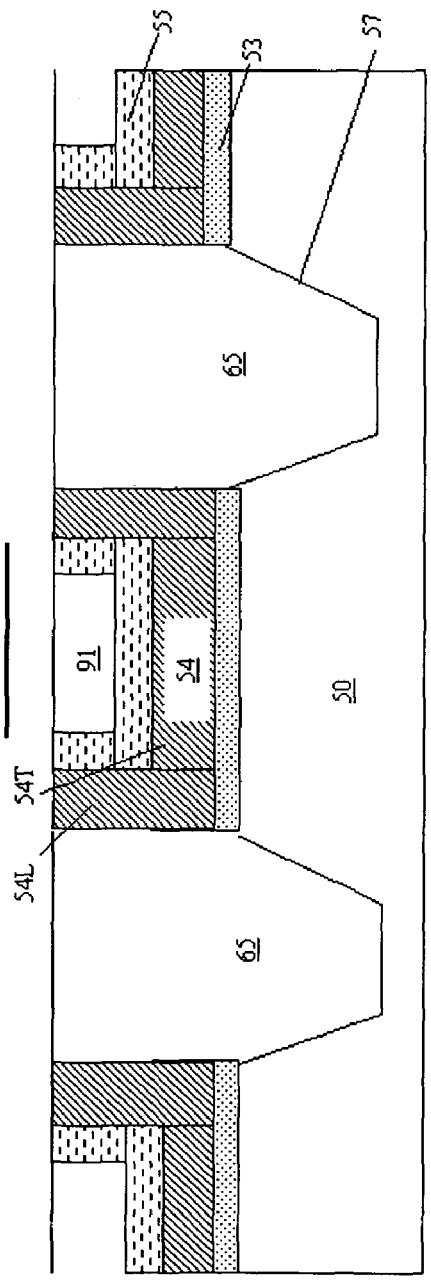

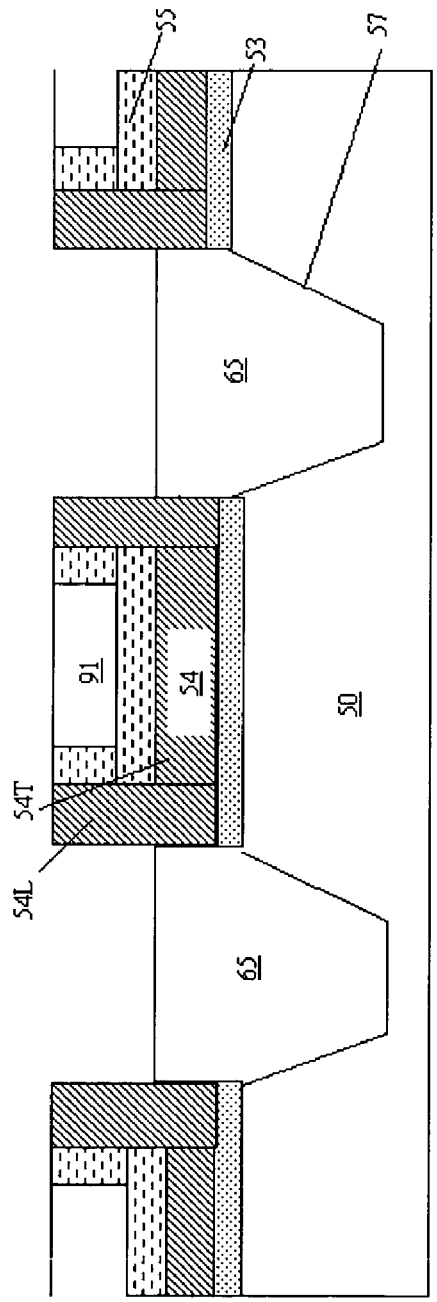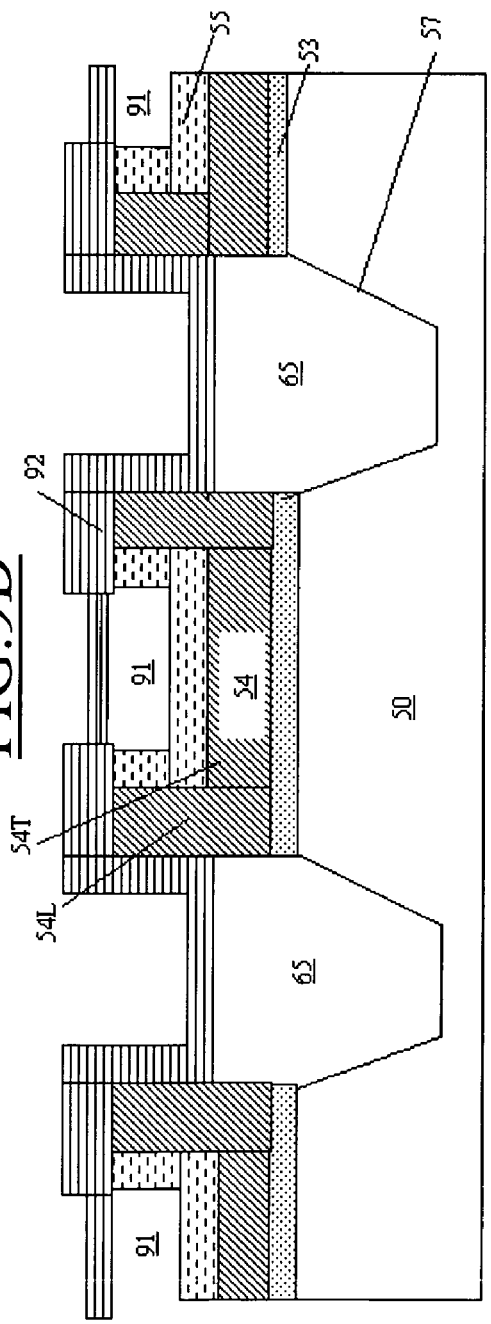

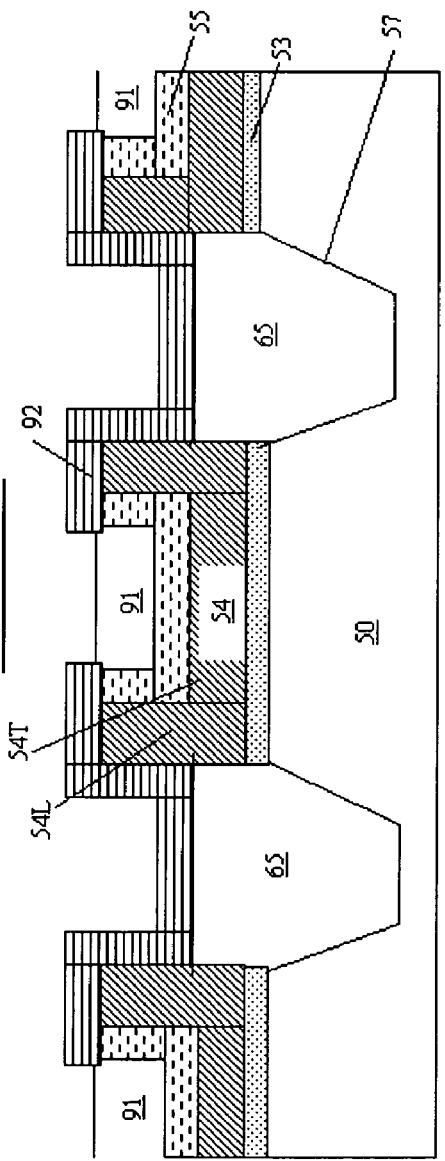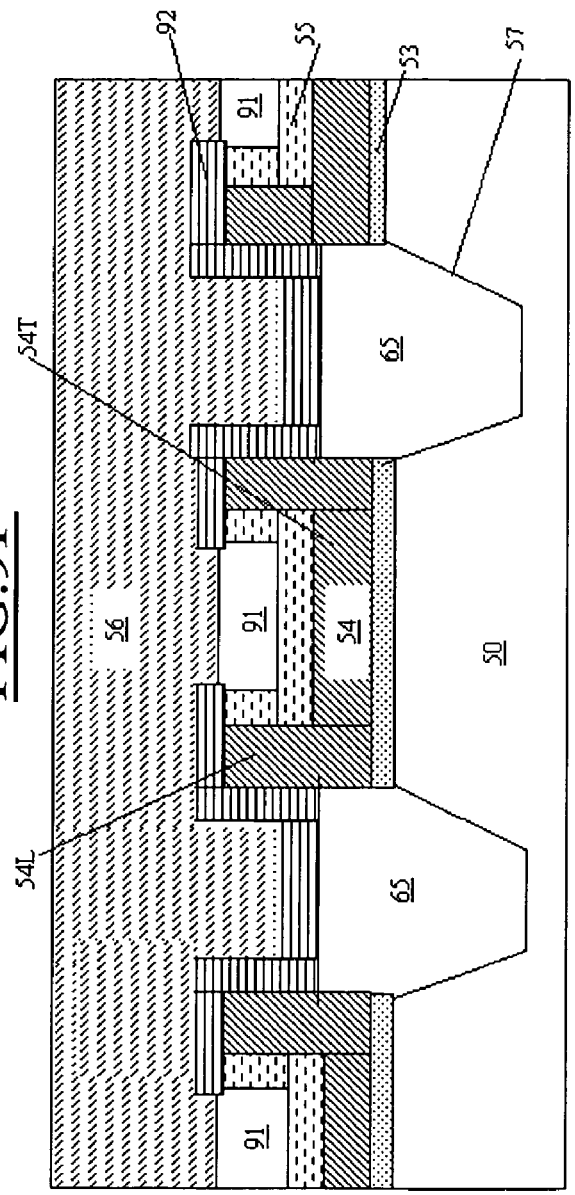

METHOD OF MAKING A FLOATING GATE NON-VOLATILE MOS SEMICONDUCTOR MEMORY DEVICE WITH IMPROVED CAPACITIVE COUPLING

PRIORITY CLAIM

This application claims priority from European patent application Nos. 04425937.2 and 04425936.4, both filed Dec. 22, 2004, which are incorporated herein by reference.

CROSS REFERENCE TO RELATED APPLICATIONS

This application is related to U.S. patent application Ser. No. 11/317,641 entitled METHOD OF MAKING A FLOATING GATE NON-VOLATILE MOS SEMICONDUCTOR MEMORY DEVICE WITH IMPROVED CAPACITIVE COUPLING AND DEVICE THUS OBTAINED, which has a common filing date and owner and which is incorporated by reference.

TECHNICAL FIELD

The present invention relates generally to a method of making a semiconductor memory device.

More precisely, the present invention relates to a method of making a floating gate non-volatile MOS memory device.

BACKGROUND

Memories are devices able to store and to make accessible information stored in binary form as bits, and they can be subdivided in various categories according to the storage capacity and to the time necessary to retrieve the information stored therein.

Semiconductor memories are made in MOS (metal-oxide-semiconductor) technology on a semiconductor material substrate, typically single crystalline silicon, and are called non-volatile when they retain the information for considerable times and in absence of power supply.

Among non-volatile MOS memories, a particularly important class is that constituted by floating gate devices, in which the single cell is constituted by a MOSFET (metal-oxide-semiconductor field effect transistor) in which the gate electrode includes an additional electrode (floating gate) placed between the channel and the control electrode (control gate), completely surrounded by electrical insulation and separated by a dielectric from the control gate.

The information stored in the cell is represented by the charging state of the gate electrode, that is modified by either injecting electrons from the FET into the floating gate (writing) or removing them (erasing).

In absence of relatively high voltages applied to the FET electrodes, the floating gate charge remains almost unaltered in time because the electrons remain in such electrode without dispersing into the surrounding environment, thanks to the presence of insulating layers that surround the floating gate.

Among the floating gate non-volatile MOS memories, a dominant position is occupied by flash memories, whose main features are given by the possibility of being written and erased electrically, by the random access not only for reading but even for writing, and by the considerable high integration density, due to the presence of a particularly compact single transistor elementary cell.

In flash memories, the mechanism adopted for writing, or programming, a memory cell is the injection into the floating gate of "hot" electrons coming from the channel and "heated" by the application of a suitable potential difference between source and drain.

In a write operation, some ten of thousands of electrons are injected into the floating gate, and the retention thereof inside the floating gate provides the memory non-volatility.

The physical mechanism adopted for erasing a flash memory cell, an operation in which the floating gate substantially is emptied of the electrons injected during the writing, is the tunneling through a dielectric of the electrons from the floating gate to the source, made possible by the application of a suitable potential difference between the control gate and the source.

The efficiency of this charge transfer process is measured by the capacitive coupling between control gate and floating gate, that is expressed in terms of a capacitive coupling coefficient $\alpha_G$, defined as the ratio between the capacitance $C_{CG}$ of the control gate and the total capacitance $C_{TOT}$ associated with the gate electrode, that also takes into account the capacitive couplings due to the presence of the source $C_S$, of the drain $C_D$, of the tunnel oxide and of the channel $C_{FG}$:

$$\alpha_G = C_{CG}/C_{TOT} = C_{CG}/(C_{CG}+C_{FG}+C_S+C_D).$$

According to a model widely in use, the sequence of control gate/dielectric/floating gate layers can be represented as a capacitor with plane and parallel plates separated by a dielectric, the floating gate and the control gate being the two plates thereof.

The capacitive coupling coefficient $\alpha_G$ is thus proportional to the capacitance $$C_{CG} = \epsilon_{diel}(A_{FG}/T_{diel})$$

where $\epsilon_{diel}$ is the dielectric constant of the dielectric, $A_{FG}$ is the area of the floating gate surface facing the control gate, and $T_{diel}$ is the dielectric thickness.

Consequently, the capacitive coupling coefficient $\alpha_G$ strongly depends on the shape and the size of the floating gate and, in particular, it is proportional to the floating gate surface area facing the control gate.

In FIGS. 1 and 2 there are shown, in simplified way, respectively a cross section and a circuit scheme of a portion of a matrix 200 of flash memory cells, such cross section being taken along a direction AA' and along a direction BB' perpendicular thereto.

FIG. 1 evidences the layered structure of the gate electrode region 4, the wells of the source region 1 and drain region 2, and the central electrically active region 10, formed by the FET channel within a silicon single crystalline substrate 3.

Over the FET channel 10, the gate-electrode region 4 is constituted by:

a first thin dielectric layer 5, typically silicon oxide, called tunnel oxide;

the floating gate 6, usually formed by a heavily doped polycrystalline silicon layer;

a second dielectric layer 7, made for example of a succession of $SiO_2/Si_3N_4/SiO_2$ thin layers called ONO (acronym for oxide-nitride-oxide), that covers the floating gate 6;

the control gate 8, typically formed by a heavily doped polycrystalline silicon layer.

Along the direction BB' the memory cells 100 are separated by insulating regions 9, that in the currently more advanced technologies are of STI (shallow trench isolation) type, i.e., they are constituted by trenches in the single crystalline silicon substrate 3, filled up by one or more dielectric layers.

Typically, the memory cells 100 are organized in a matrix structure, that, as shown by way of example in FIG. 2 for a NOR matrix 200 of flash type memory cells 100, is arranged in rows 21, called word lines, running along the direction BB', and columns 22, called bit lines, running along the direction AA'.

In the matrix 200 the control gates 8 of the memory cells 100 form the word lines 21, and along this direction source connection lines 24, constituted by semiconductor material, extend in regular intervals, for example every sixteen cells, running parallel to the bit lines 22.

The bit lines 22, which constitutes the drain connection lines, are formed by conductor material, typically a metal or an alloy of one or more metals (for example Al, AlCu, Cu, W . . . ) and run perpendicularly to the word lines 21.

In the direction of the bit lines 22, the drains 2 of adjacent memory cells 100 face each other, and in correspondence to each pair of faced drains 2 drain electric contacts 23 are provided along the bit lines 22, connecting the drains 2 to the bit lines 22.

Also the sources 1 of adjacent memory cells 100 face each other in the direction of the bit lines 22, and the diffusion source lines 26 connect them to source connection lines 24 by means of source electric contacts 25, along the direction of the word lines 21.

A conventional process for the fabrication of flash memories calls for the formation of the insulation regions 9, for example of STI type, and of the floating gates 6 of the memory cells 100 through the following phases:

1. On the single crystalline silicon substrate 3, a sufficiently thin dielectric layer is grown, of thickness ranging from 10 to 20 nm, called pad oxide;
2. On the pad oxide, a silicon nitride layer of thickness typically ranging from 100 nm to 200 nm is deposited, that has the function of stop layer for the following planarization treatments;
3. The areas where the STI type isolation regions 9 will be made are defined by lithography;
4. The nitride layer and the pad oxide are removed in sequence from these areas, and trenches of the desired depth, typically about 150 nm, are formed inside of the single crystalline silicon substrate 3;
5. The trenches are filled with one or more layers of dielectric material, that as a whole are called field oxide;
6. The field oxide is planarized, typically using the CMP (chemical mechanical polishing) technique, in such a way as its exposed surface is flush with that of the still present nitride portion;
7. The exposed field oxide surface level is lowered, typically by a wet etch in hydrofluoric acid (HF), so that at the end of the process the height difference between the field oxide surface and the surface of the single crystalline silicon substrate 3 is not too high (~20 nm).

After having formed in this way the STI type isolation regions 9, the process of formation of the floating gates 6 of the memory cells 100 proceeds with the following phases:

8. The portion of nitride still present is removed;
9. A sacrificial dielectric layer called sarox is grown, of thickness approximately equal to 10 nm;
10. Through the sarox layer, some phases of dopant implantation are performed, necessary to the operation of the memory cell 100;
11. The sarox layer and the pad oxide layer are removed by wet etching;
12. The tunnel oxide 5 is grown, of thickness ranging from 5 nm to 10 nm;
13. A polycrystalline silicon layer is deposited, of about 100 nm thickness;
14. The polycrystalline silicon layer is defined by lithography and etching, so as to form the floating gate 6 of the memory cell 100;
15. The layer of ONO (oxide-nitride-oxide) 7 is deposited, covering the floating gate 6;
16. The control gate 8 is formed, typically made of heavily doped polycrystalline silicon.

In the last generation technologies, the memory-cell dimensions 100 are so small that to use traditional lithography for the definition of the floating gate 6, mask alignment is often critical. In fact, a possible misalignment, even minimum, in the lithographical definition phase (step 14) of the polycrystalline silicon layer, might be too great for such small geometries, and cause the memory cell 100 to be incorrectly defined.

On the other hand, the quest to reduce the memory dimensions becomes more and more pressing as the technology progresses, and this demand translates into the necessity of devising technological solutions and innovative integrated structures that allow combining in such devices an optimal electric behavior with minimal geometric dimensions.

Therefore, the possibility of making a floating gate self-aligned to the STI type isolation regions 9 has been investigated, by the deposition of the polycrystalline silicon layer immediately after the definition of the STI type isolation regions 9, and its subsequent planarization by CMP technique.

An example of flash memory cell 300 with floating gate 6A self-aligned to the STI type isolation regions is shown in FIG. 3 in schematic transversal section along the direction BB', not to scale and limited to the layers of interest. Along the direction AA', the flash memory cell 300 has a structure similar to the memory cell 100 shown in FIG. 1.

In detail, the solution with floating gate 6A self-aligned to the STI type isolation regions, similarly to the traditional process flow, provides for performing the phases of growth of the pad oxide layer (step 1), deposition of the silicon nitride layer (step 2 above), lithographical definition of the areas where the STI-type isolation regions will be formed (step 3 above), removal in these areas of the silicon nitride and pad oxide layers and formation of trenches in the single crystalline silicon substrate 3 (step 4 above), filling of the trenches by the field oxide (step 5 above), and planarization of the field oxide (step 6 above) by a CMP technique.

At this point of the process flow, differently from the traditional process flow, the step of lowering (step 7 above) of the exposed field oxide surface level is not performed.

Then, in a way similar to the traditional process flow, the steps of removal of the silicon nitride (step 8 above) still present, growth of the sarox layer (step 9 above), doping implantations necessary to the working of the memory cell 300 (step 10 above), removal of the sarox and pad oxide layers (step 11 above), and growth of the tunnel oxide 5 (step 12 above) are performed.

After the step (step 12 above) of growth of the tunnel oxide 5, the solution with floating gate 6A self-aligned to the STI-type isolation regions provides for the following process steps:

13A. A polycrystalline silicon layer is deposited, of thickness of about 200 nm. The deposition of a thicker polycrystalline silicon layer compared to the traditional process flow is due to the necessity of having a layer to be planarized that is as uniform as possible;

14A. The polycrystalline silicon layer is planarized by CMP technique so that its exposed surface is flush with that of the field oxide;

14B. The exposed field oxide surface level is lowered, typically by a wet etching in hydrofluoric acid (HF), in such a way to uncover the side walls of the floating gate 6A.

Then, in a way similar to the traditional process flow, the step of deposition (step 15 above) of the ONO layer 7 and the step of formation (step 16 above) of the control gate 8 are performed.

Since in this way the floating gate 6A is self aligned to the STI type isolation regions 9, this process flow allows obtaining memory cells 300 of reduced dimensions compared to the memory cells 100 made by the traditional process flow.

Regretfully, for a given thickness of deposited polycrystalline silicon layer, this last-generation process flow produces floating gates 6A of such a morphology that strongly reduces the capacitive coupling coefficient $\alpha_G$ between floating gate 6A and control gate 8.

In fact, comparing the morphology of the traditional floating gate 6 of the memory cell 100 with that of the floating gate 6A of the memory cell 300 as represented in FIG. 4, it can be noticed that the traditional floating gate 6 has some protrusions, so-called "wings", that extend over the adjacent STI-type isolation regions 9. Such wings are instead missing in the case of the floating gate 6A self-aligned to the STI-type isolation regions 9 of the memory cell 300.

The lack of these "wings", due to the complexity of the process phases that are used for the realization of the floating gate 6A, causes the width W2 of the floating gate 6A self-aligned to the STI type isolation regions 9 to be smaller than the width W1 of the traditional floating gate 6.

Besides, the effective thickness T2 of the floating gate 6A is also lower than that of the traditional floating gate 6, indicated with T1.

This difference is due to the fact that in the process flow realizing the floating gate 6A self-aligned to the STI type isolation regions 9 the step of lowering of the level of the exposed field oxide surface (step 14B above) is performed after the growth phase (step 12 above) of the tunnel oxide 5. Therefore, a margin, on the order of the about ten nanometers, is required in the lowering step (step 14B above) of the exposed field oxide surface so as to preserve of the tunnel oxide 5.

Accordingly, the side walls of the floating gate 6A are partially covered by field oxide, and therefore the effective thickness T2 of the floating gate 6A self-aligned to the STI-type isolation regions 9 is lower than the effective thickness T1 of the traditional floating gate 6.

These differences in the geometric dimensions of the floating gate 6 and 6A reflect in the values of the capacitive coupling coefficients $\alpha_G$ of the traditional memory cell 100 and of the memory cell 300 with floating gate to the STI-type isolation regions 9, whose ratio is expressed by the relationship:

$$\alpha_G(300)\alpha_G(100)\div(W2+2T2)/(W1+2T1)$$

from which it can be deduced that, W2 and T2 being lower than W1 and T1, the capacitive coupling coefficient $\alpha_G$ of the memory cell 300 with a floating gate 6A self-aligned to the STI-type isolation regions 9 is lower than the corresponding capacitive coupling coefficient $\alpha_G$ of the traditional memory cell 100.

It has been verified experimentally that this difference can be estimated to be of order of at least 10%.

Such an efficiency loss in the capacitive coupling $\alpha_G$ leads to an increase in the erasing time of the memory cell 300 with floating gate 6A self-aligned to the STI type isolation regions 9, since the charge transfer process from the floating gate 6A to the source region 1 is less efficient, and thus may cause the final erase voltage to be higher than with the floating gate 6.

The management of high erase voltages is often burdensome and can cause a phenomenon such as of degradation of the quality of the active oxides, worsening the characteristics of reliability of the memory cell 300 with floating gate 6A self-aligned to the STI type isolation regions 9, the electric performance of which may be accordingly limited.

The formation of the floating gate 6A starting from a thicker deposited polycrystalline silicon allows partial recovery of the loss of capacitive coupling between floating gate and control gate, but this may introduce other problems; in particular, the filling by field oxide of the isolation trenches may become difficult because of the increased depth of the trench to be filled.

SUMMARY OF THE INVENTION

According to an embodiment of the invention, a method is provided for obtaining a floating gate non-volatile MOS memory device having very small geometric dimensions, and in which the memory cells have a capacitive coupling coefficient $\alpha_G$ between control gate and floating gate higher than that obtainable according to the prior art, thus overcoming limitations and drawbacks that still limit the devices of this type made according to the prior art.

Particularly, an embodiment of the present invention is a method for making a non-volatile MOS semiconductor memory device including a step of formation, in a semiconductor material substrate, of STI (shallow trench isolation) isolation regions filled by field oxide and of memory cells separated one from the other by said STI-isolation regions. The memory cells include a gate electrode electrically insulated from said substrate of semiconductor material by a first dielectric layer and said gate electrode includes a floating gate self-aligned to said STI-isolation regions. The method comprises a step of formation of said floating gate exhibiting substantially a saddle shape including a concavity, said formation step of said floating gate including a deposition step of a first conformal conductor material layer.

BRIEF DESCRIPTION OF THE DRAWINGS

Embodiments of the present invention, as well as further features and advantages thereof, will be best understood by reference to the following detailed description, given purely by way of a non-restrictive example, to be read in conjunction with the accompanying drawings, wherein:

FIGS. 6A through 6E show, in transversal section along the direction BB', some process steps for making STI type isolation regions and tunnel oxide, according to an embodiment of the invention;

FIGS. 7A through 7E depict, in transversal section along the direction BB', some steps of a method of making a non-volatile MOS memory device with floating gate self-aligned to STI-type isolation regions according to a first embodiment of the invention;

FIGS. 8A through 8C show, in transversal section along the direction BB', a sequence of steps of a method of making non-volatile MOS memory device with floating gate self-aligned to STI-type isolation regions according to a second embodiment of the invention;

FIGS. 9A through 9F represent, in transversal section along the direction BB', a sequence of steps of a method of making a non-volatile MOS memory device with floating gate self-aligned to STI-type isolation regions according to a third embodiment of the invention.

DETAILED DESCRIPTION

Figure 1:
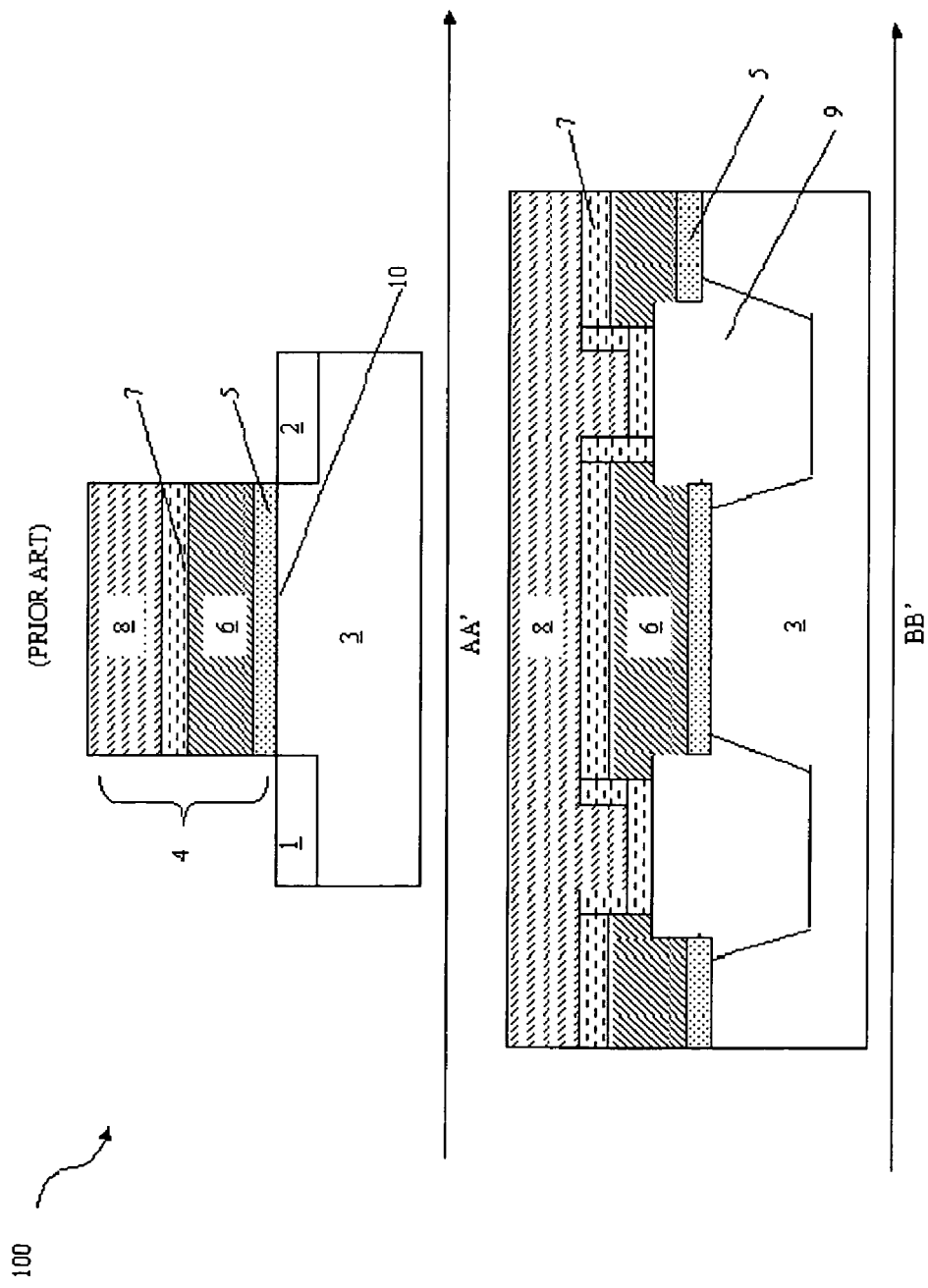
FIG. 1 shows in schematic transversal section a flash memory cell according to the prior art, along two perpendicular directions AA' and BB'.
Figure 2:
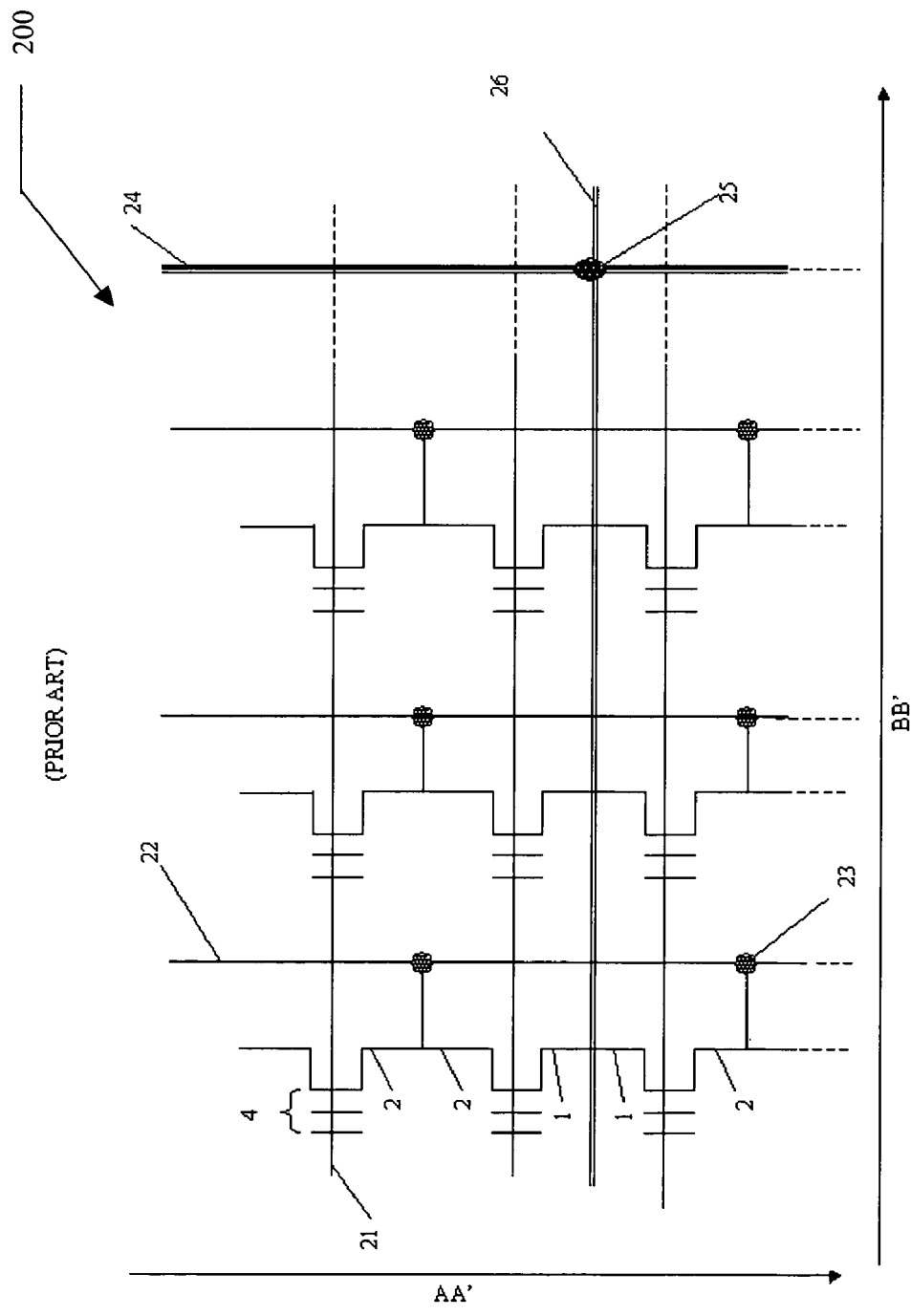
FIG. 2 shows a circuit diagram of a portion of a typical matrix structure of flash NOR memory cells according to the prior art.
Figure 3:
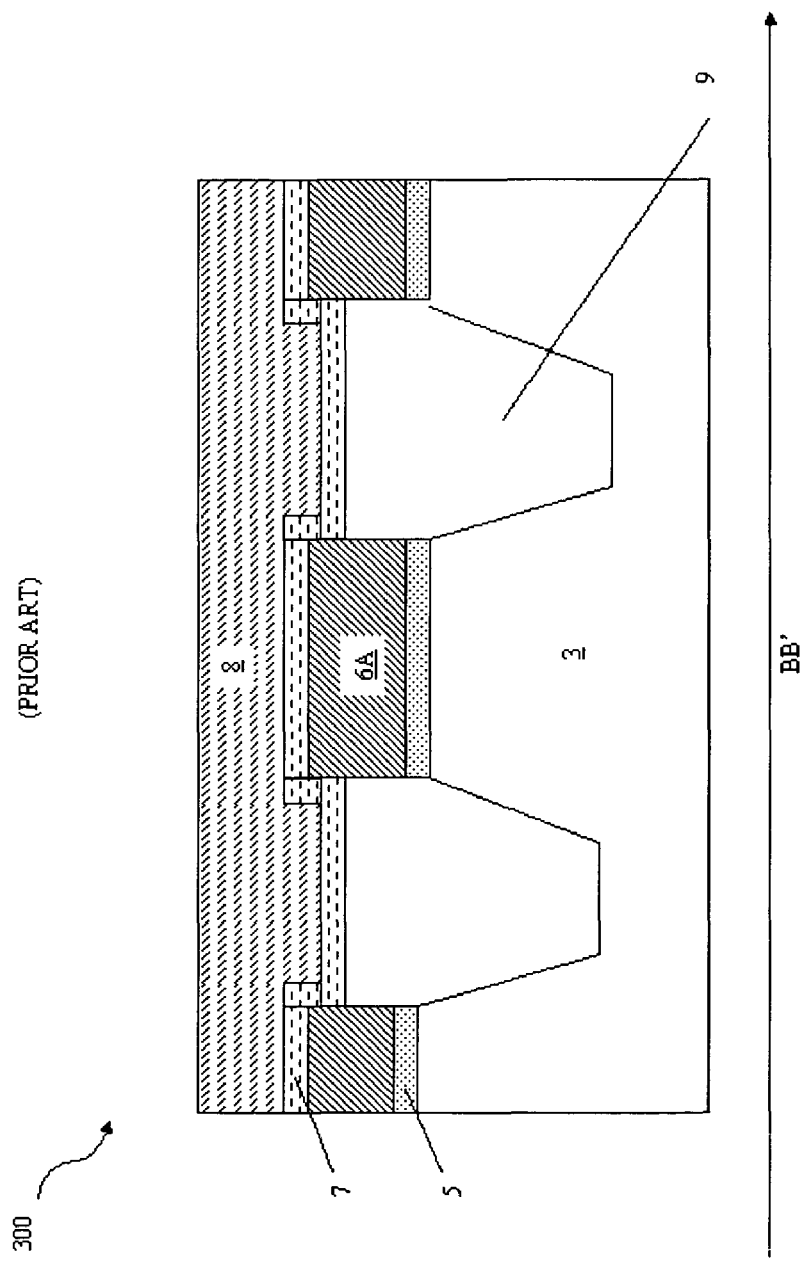
FIG. 3 shows a flash memory cell with floating gate self-aligned to STI type isolation regions according to the prior art, in schematic transversal section, along the direction BB'.
Figure 4:
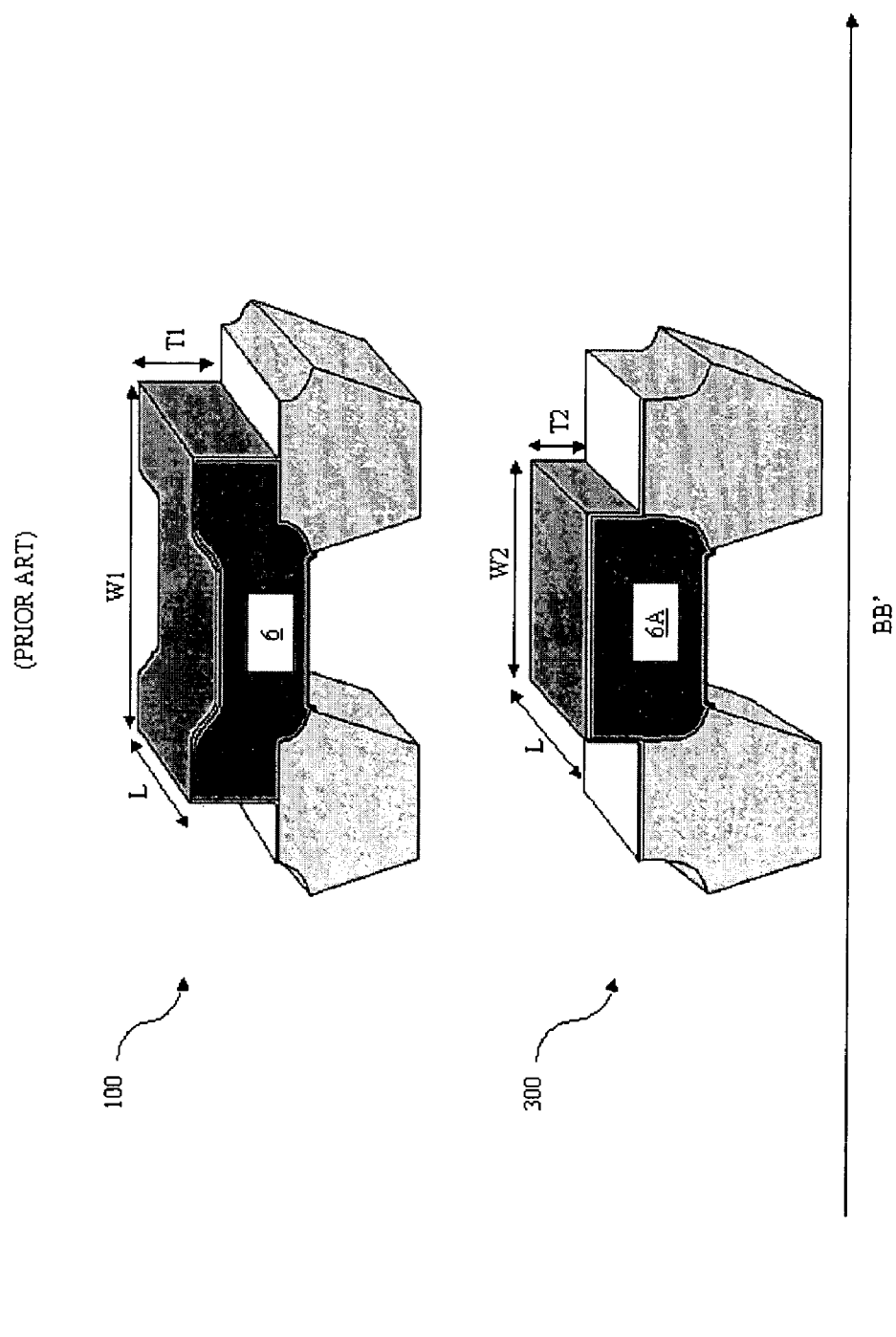
FIG. 4 shows in perspective view the comparison between the morphology of the transversal section of a flash memory cell with floating gate self-aligned to STI type isolation regions and that of a traditional memory cell, according to the prior art, along the direction BB'.

In the following description, it should be noted that the drawings may not be to scale: relative dimensions and proportions of parts of the drawings may have been increased or reduced in size for the sake of clarity.

It is pointed out that although in the drawings and in the following description a particular method of manufacturing a flash-type non-volatile MOS memory device with floating gate self-aligned to STI-type isolation regions is considered, this is not to be construed as a limitation of the invention, which can, for example, also be straightforwardly applied to different types of non-volatile MOS memory devices with floating gate self-aligned to STI-isolation regions.

Figure 5:
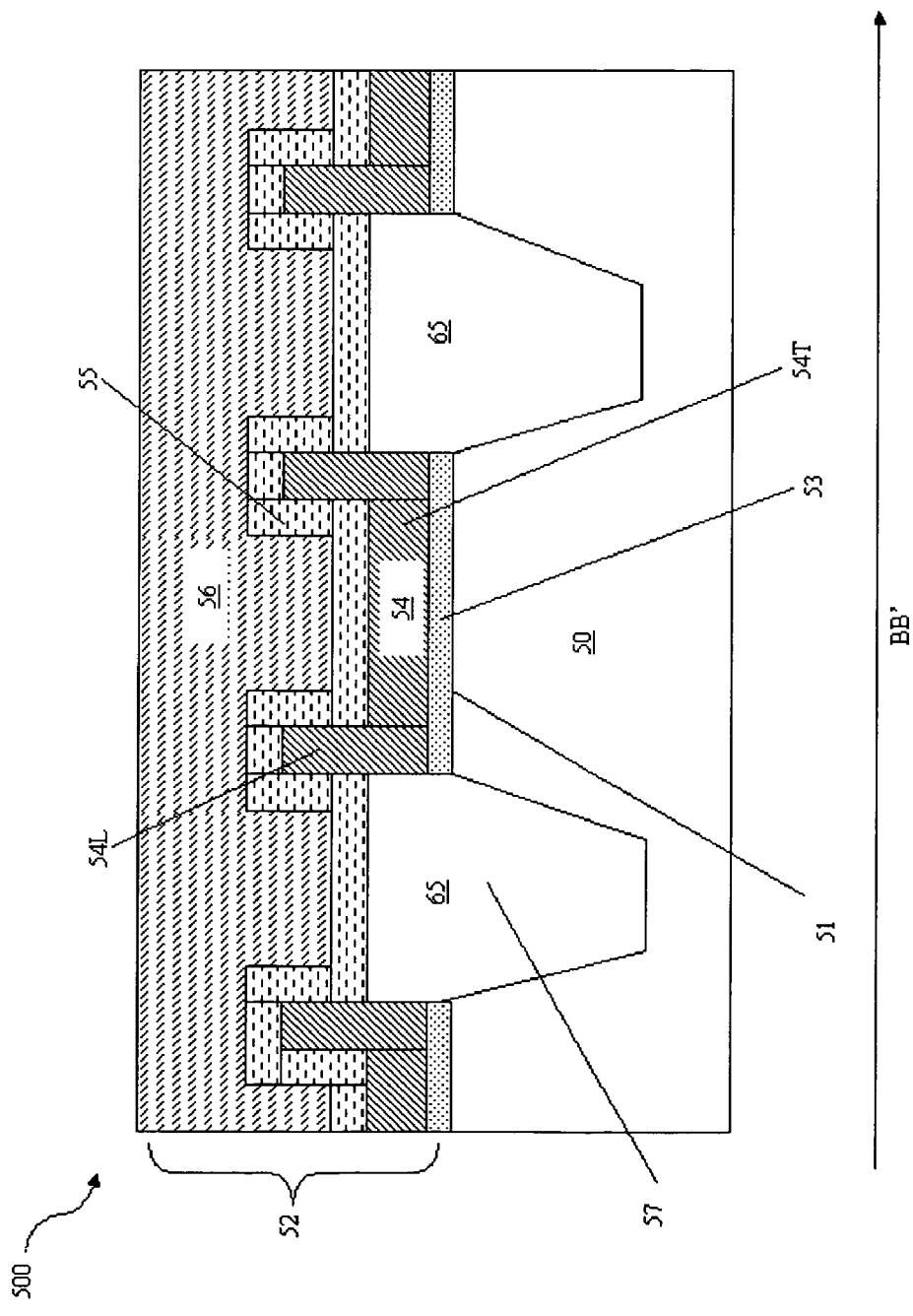
FIG. 5 shows, in schematic transversal section and limited to the layers of interest, a non-volatile MOS memory cell with floating gate self-aligned to STI-type isolation regions according to an embodiment of the invention, along the direction BB'.

With reference to FIG. 5, an example of a flash-type memory cell 500 inside a non-volatile MOS memory device, obtained according to an embodiment of the invention, is represented in schematic transversal section, which is limited to the layers of interest along the direction BB', and which includes an electrically active region 51 inside a single crystalline silicon substrate 50, cupped by a layer structure that constitutes the gate electrode region 52.

The gate electrode region 52 includes:
a first, thin dielectric layer 53, typically silicon oxide, called tunnel oxide;
the floating gate 54, including a first conductor material layer, for example heavily doped polycrystalline silicon;
a second dielectric layer 55, for example constituted by a $SiO_2/Si_3N_4/SiO_2$ layers sequence called ONO (oxide-nitride-oxide), that covers the floating gate 54;
the control gate 56, formed by a second conductor material layer, for example heavily doped polycrystalline silicon.

Along the direction BB', the direction along which the word lines extend, adjacent memory cells 500 are separated by STI (shallow trench isolation) type isolation regions 57.

According to an embodiment of the invention, the floating gate 54 advantageously takes a concave, generically saddle form. Particularly, the floating gate 54 includes a base wall 54T and side walls 54L, of shape and thickness such as to cause the floating gate 54 to exhibit a concavity facing upward that makes the floating gate take a generically "U" shape. The floating gate 54 also advantageously includes a conformal material conductor layer, that is such as to substantially follow the profile of the underlying layers. These characteristics of the floating gate 54 provide a gate capacitive coupling $\alpha_G$ of the memory cell 500 that is higher compared to the prior art, and they favor a reduction of the reading disturbances associated with the capacitive couplings between the floating gates 54 of adjacent memory cells 500.

Particularly, according to an embodiment of the invention, said side walls 54L protrude from said base wall 54T to a height equal to at least five times the thickness of said base wall 54T.

The structure just described can be obtained according to an embodiment of the invention by the process flow that is described in the following, that is limited to the description of the process steps of interest, and is not exhaustive of a process flow suitable for obtaining an integrated memory device according to well known techniques.

With reference to FIGS. 6A-6E and 7A-7E, an embodiment of the proposed innovative solution includes the following process steps for the formation of the STI isolation regions 57 and of the floating gates 54 self-aligned to the STI isolation regions 57:

1. A sufficiently thin dielectric layer 62 called pad oxide is grown on the single-crystalline silicon substrate 50, of thickness ranging, for example, from 10 to 20 nm, (FIG. 6A);

2. On the pad oxide 62, a silicon nitride layer 63 of thickness ranging, for example, from 100 nm to 200 nm is deposited, that has the function of a stop layer for the following treatments of planarization (FIG. 6A);

3. The areas where the STI isolation regions 57 will be made are defined, for example by lithography with photosensitive material 64 (FIG. 6A);

4. From these areas, the silicon nitride layer 63 and the pad oxide 62 are removed in sequence, for example by an anisotropic dry etch. Simultaneously, trenches of desired depth are formed in the single crystalline silicon substrate 50, for example on the order of 150 nm (FIG. 6B);

5. The trenches are filled with one or more layers of dielectric material, that forms the field oxide 65 (FIG. 6B);

6. The field oxide 65 is planarized, using for example the CMP (chemical mechanical polishing) technique, so that its exposed surface is flush with that of the still present silicon nitride portion 63 (FIG. 6C).

Figure 6E:
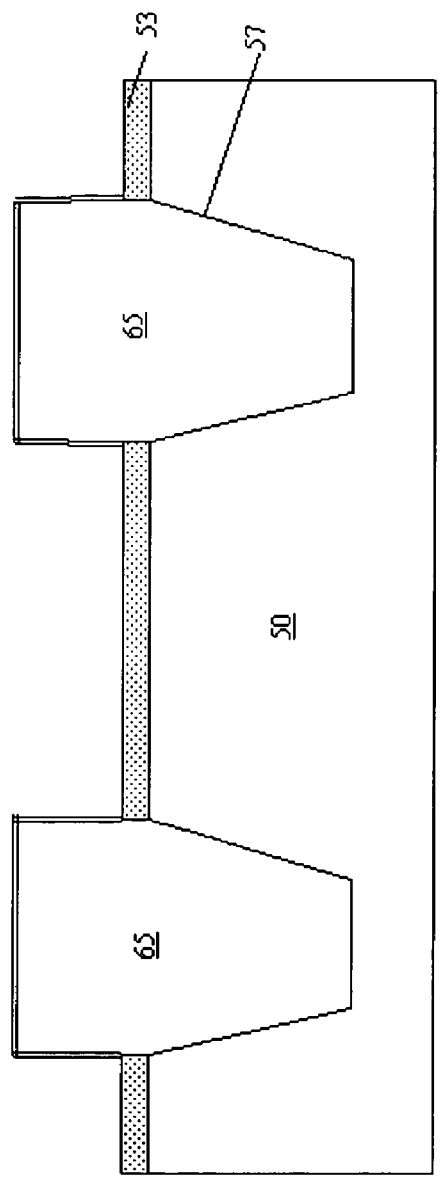

After having formed in this way the STI isolation regions 57, the process of formation of the floating gates 54 self-aligned to the STI isolation regions 57 proceeds with the following steps:

7. The portion of silicon nitride 63 still present is removed (FIG. 6D);

8. A sacrificial dielectric layer 66 called sarox is grown, for example of a thickness of about 10 nm. Through the sarox layer 66, some steps of implantation of dopants necessary to the memory cell 500 operation (FIG. 6D) can be performed;

9. The sarox layer 66 and the pad oxide 62 layer are removed, for example by a wet etching (FIG. 6E);

10. The tunnel oxide 53 is grown, preferably of thickness ranging from 5 nm to 10 nm (FIG. 6E).

Figure 7E:
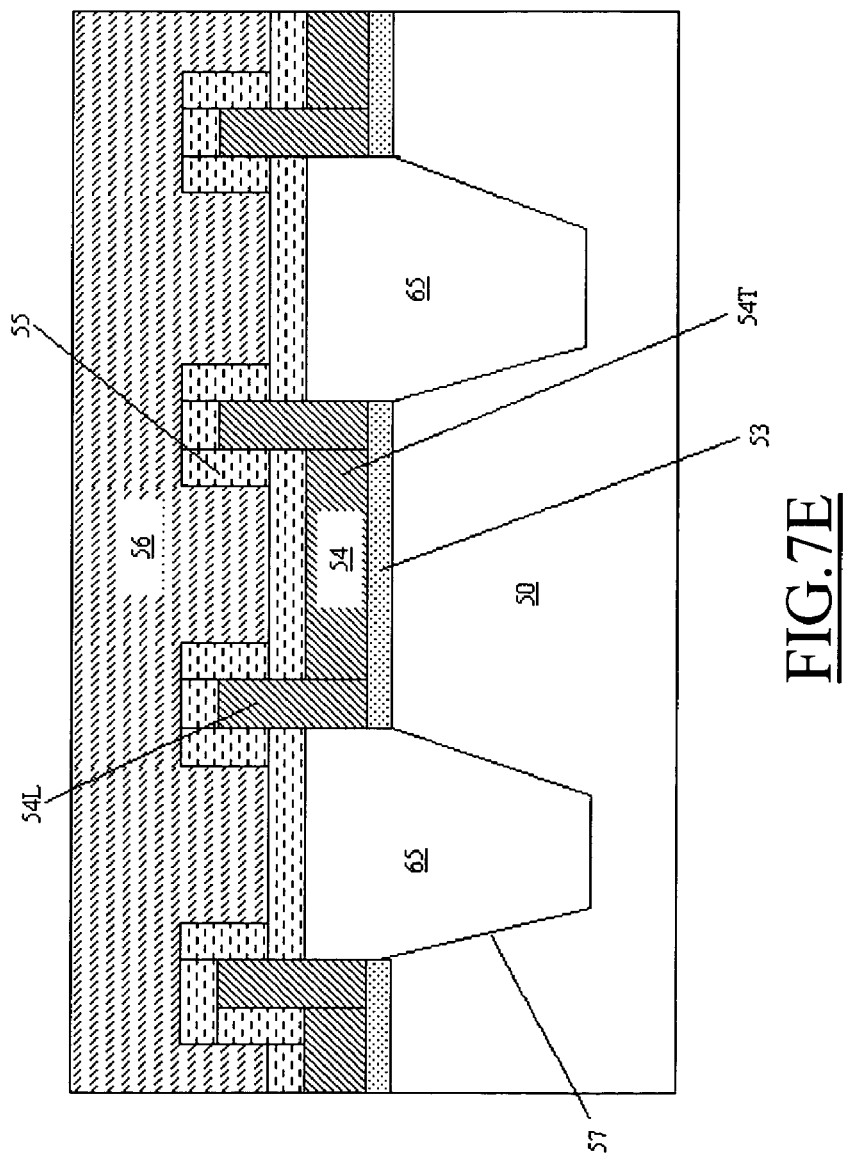

After the step (10) of tunnel oxide growth 53, a first embodiment of the invention advantageously proposes the following process steps, shown in FIGS. 7A-7E:

11. A conductor material layer 54A is deposited, for example heavily doped polycrystalline silicon, of thickness such as to be conformal (FIG. 7A). This characteristic of the conductor material layer 54A, in combination with the presence of underlying layers of suitable profile, advantageously causes it to take, inside the electrically active regions 51 (FIG. 5), the concave, saddle shape previously defined. The layer 54A of conformal conductor material forms the floating gate 54 of the memory cell 500, and for example has a thickness ranging from 1 nm to 70 nm, preferably 10 nm;

12. A dielectric layer 71 is deposited, for example silicon oxide, of thickness ranging from, for example, 100 nm to 1000 nm, preferably ranging from 500 nm to 600 nm, that fills the concavity of the conductor material layer 54A (FIG. 7B);

13. The dielectric layer 71 and the conformal conductor material layer 54A are planarized, for example by a CMP (chemical mechanical polishing) technique, up to uncovering the field-oxide surface 65, so as to remove the portion of the conductor material layer 54A that is above the field oxide 65 (FIG. 7C). In this way the formation of the floating gate 54 is completed, the floating gate advantageously has the concave saddle shape defined above, with base wall 54T and side walls 54L;

14. The dielectric layer 71 is removed, for example by a wet etching, for example in hydrofluoric acid (HF). Advantageously, during such etch the level of the exposed field oxide surface 65 is lowered too, in such a way to uncover the side walls 54L of the floating gate 54 (FIG. 7D);

15. The dielectric layer 55, for example ONO (oxide-nitride-oxide), is deposited, covering the floating gate 54 (FIG. 7E);

16. The control gate 56 is formed, made for example of heavily doped polycrystalline silicon (FIG. 7E).

The process continues according to a traditional scheme, with an anisotropic etch of the control gate 56, ONO 55 and floating gate 54 layer sequence, followed by a sequence of known operations that lead to the finished memory device.

An alternative to the sequence of process steps just described, according to a second embodiment of the invention, includes replacing the deposition step (12) of the dielectric layer 71, the step (13) of planarization of the dielectric layer 71 and of the conformal conductor material layer 54A, and the removal step (14) of the dielectric layer 71 from the concavity of the floating gate 54, and simultaneous lowering of the level of the exposed field oxide surface 65, with the following process steps, shown in FIGS. 8A-8C:

12A. The portion of the conductor material layer 54A above the field oxide 65 is removed, for example by a CMP (chemical mechanical polishing) technique, so as to leave the conductor material layer 54A only inside the electrically active regions 51 (FIG. 8A). In this way, the formation of the floating gate 54 is completed; the floating gate advantageously has the concave saddle, shape previously defined, with base wall 54T and side walls 54L;

13A. The level of the exposed field oxide surface 65 is lowered, by a wet etching, for example in hydrofluoric acid (HF), in such a way to uncover the side walls 54L of the floating gate 54 (FIG. 8B);

14A. The dielectric layer 55, for example ONO (oxide-nitride-oxide), is deposited, covering the floating gate 54 (FIG. 8C);

15A. The control gate 56 is formed, made for example of heavily doped polycrystalline silicon (FIG. 8C).

The process proceeds in a conventional way, by the anisotropic etch of the control gate 56, ONO 55 and floating gate 54 sequence of layers, and following steps.

A third embodiment of the invention proposes instead, after the deposition step (11) of the conformal conductor material layer 54A, the following process steps, shown in FIGS. 9A-9F:

12B. The dielectric layer 55, for example ONO (oxide-nitride-oxide), is deposited (FIG. 9A);

13B. The concavity of the conductor material layer 54A is filled by the deposition of a conductor material layer 91, for example a metallic alloy such as TiN (titanium nitride) or SiTiN, having an oxidation rate lower than the conductor material layer 54A, for example polycrystalline silicon (FIG. 9A). The thickness of the conductor material layer 91 ranges, for example, from 1100 nm to 1000 nm, preferably from 500 nm to 600 nm;

14B. The layers of conductor material 91, ONO 55 and conductor material 54A are planarized, for example by a CMP (chemical mechanical polishing) technique, up to uncover the field oxide surface 65, so as to remove the portion of the conductor material layer 54A that is above the field oxide 65 (FIG. 9B). In this way the formation of the floating gate 54 is completed, that advantageously has the concave, saddle shape defined above, with base wall 54T and side walls 54L;

15B. The level of the exposed field oxide surface 65 is lowered, in such a way to uncover the side walls 54L of the floating gate 54 (FIG. 9C);

16B. A thin oxide layer 92 is grown by means of an oxidation, preferably of thickness equivalent to that of the ONO layer 55, or for example ranging from 5 nm to 50 nm, preferably ranging from 10 nm to 15 nm (FIG. 9D). In this way, the conductor material layer 91 is laterally isolated. Besides, since the conductor material layer 91 has an oxidation rate lower than the conductor material of the floating gate 54, on the exposed surface of the floating gate 54 an oxide 92 grows of thickness greater than that of the oxide grown on the exposed surface of the conductor material layer 91;

17B. An oxide-removal operation is performed that removes the oxide portion 92 grown on the conductor material layer 91 during the oxidation phase 17B (FIG. 9E). For the reasons explained in the above description of step 16B, such oxide-removal operation does not completely remove the oxide portion 92 grown on the floating gate 54, thus insulating the floating gate;

18B. The control gate 56 is formed, made for example of heavily doped polycrystalline silicon (FIG. 9F).

The process proceeds following a known process scheme that results in the finished memory device.

Figure 10A:
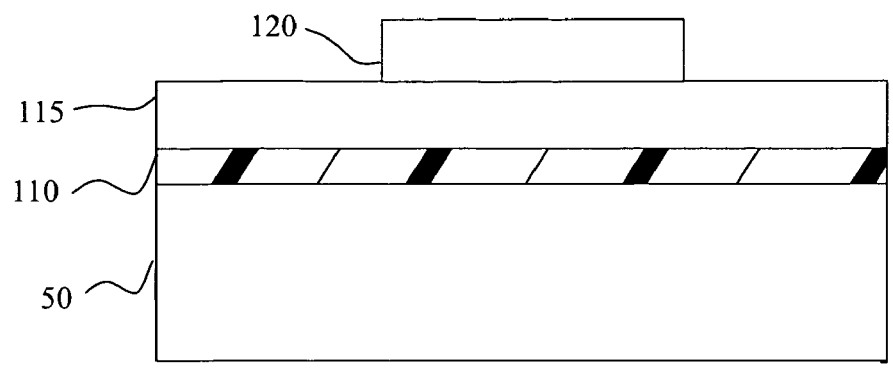
FIGS. 10A through 10I represent, in transversal section along the direction BB', a sequence of steps of a method of making a non-volatile MOS memory device with floating gate self-aligned to STI-type isolation regions according to a fourth embodiment of the invention.
Figure 10B:
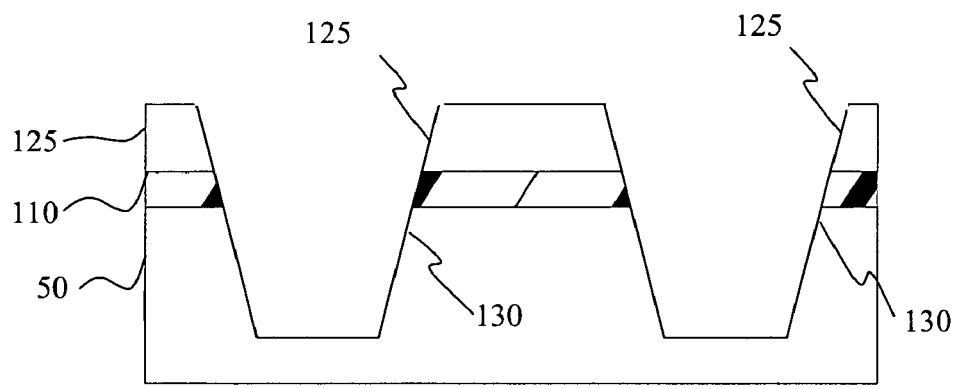
Figure 10C:
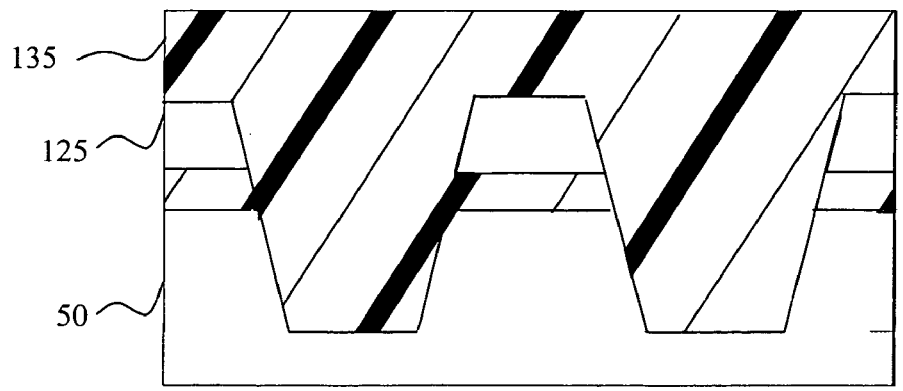
Figure 10D:
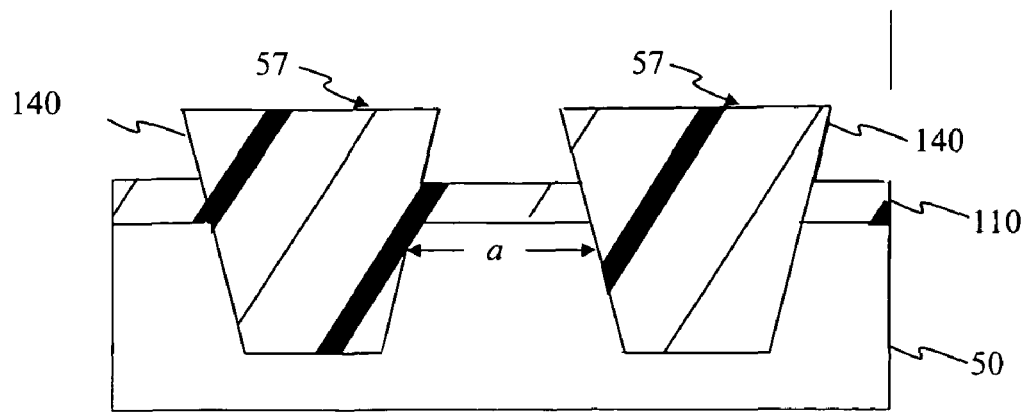

Referring to FIGS. 10A through 10l, a fourth embodiment of the present invention is proposed. In particular, an alternative way of realizing a U-shaped floating gate is proposed. The fourth embodiment of the proposed solution includes the following process steps for the formation of the STI isolation regions 57 and of the floating gates 54 self-aligned to the STI isolation regions 57:

1. A sufficiently thin sacrificial dielectric layer 110, so-called sarox, is grown on the single crystalline silicon substrate 50, preferably of thickness ranging for example from 10 nm to 20 nm (FIG. 10A);

2. On the sarox layer 110, a silicon nitride layer 115 of thickness ranging for example from 100 nm to 200 nm is deposited, that has the function of a stopping layer for the following treatments of planarization (FIG. 10A);

3. The areas where STI isolation regions 57 will be made are then defined, for example by means of a lithographic process using a photosensitive material 120 (FIG. 10A);

4. As shown in FIG. 10B, from these areas, the silicon nitride layer 115 and the sarox layer 110 are removed in sequence, for example by means of a dry etching process. The dry etching is such that the silicon nitride layer 115 is etched laterally and vertically so that the remaining silicon nitride portions 125 have oblique (i.e., not vertical) walls. Simultaneously, the crystalline silicon substrate 50 is etched in order to form trenches 130 extending to a desired depth, for example ranging from 130 nm to 200 nm;

5. The trenches 130 are then filled with one or more layers of dielectric material. For example, and not limitatively, a HDP (High Density Plasma) CVD deposition process of silicon oxide 135 may be carried out (FIG. 10C);

6. The silicon oxide 135 is then planarized, using for example a CMP technique, until its exposed surface is flush with that of the still present silicon nitride portions 125. In such a way, each resulting isolation region 57 has lateral walls 140, adjacent to the silicon nitride portion 125, which are also oblique, thereby the silicon oxide 135 is flared at the top, the walls thereof forming, with the surface of the sarox layer 110, an angle smaller than 90°, for example ranging from 80° to 90°. Then, the silicon nitride portions 125 still present are removed, so as to leave exposed the lateral walls 140 of the isolation regions 57 (FIG. 10D).

In such a way, the isolation regions 57 are formed, adapted to isolate from each other active areas extending for an active area length a in the substrate 50 below the sarox layer 110, which active areas will form the channel regions of the memory cells.

Figure 10E:
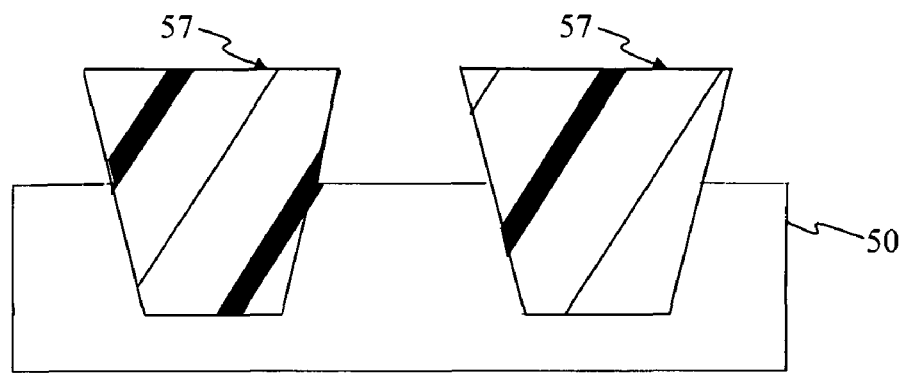
Figure 10F:
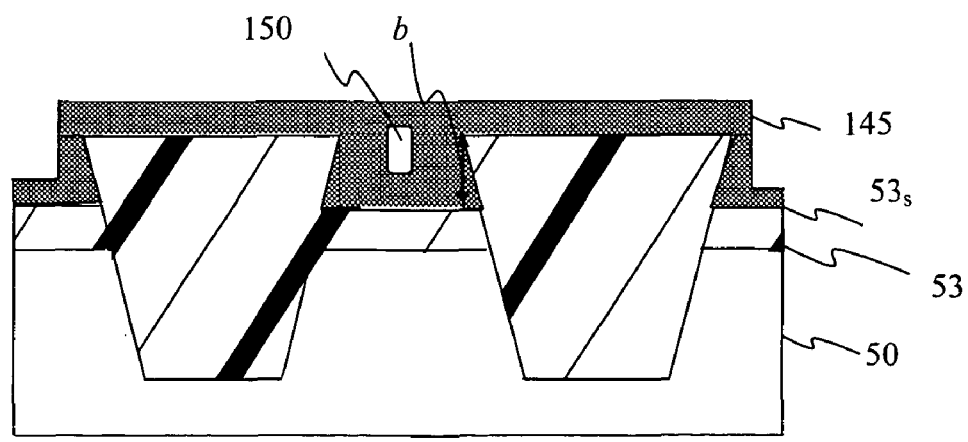

After the definition of the isolation regions 57, the process continues with the following steps:

7. The sarox layer 110 is then removed, for example by means of a wet etching process (FIG. 10E);

8. The tunnel oxide 53, having a surface $53_s$, is then formed (e.g., grown). Preferably, the tunnel oxide 53 has a thickness such that the isolation regions 57 protrude a predetermined distance b from the surface $53_s$ of the tunnel oxide. For example, the thickness of the tunnel oxide ranges from 5 nm to 10 nm and the distance b ranges from 50 to 110 nm. Then, a conductive material layer (for example, polycrystalline silicon) 145 is formed, e.g., deposited on the tunnel oxide surface $53_s$; the thickness of the conductive material layer 145 is such that the layer, once deposited, substantially follows the profile of the underlying layers. This characteristic of the conductor material layer 145, in combination with the presence of underlying layers of suitable profile, advantageously causes it to form a relatively small seam, with a small interstitial space 150 within the conductive material layer 145 (FIG. 10F).

In particular, the size of the interstitial space 150 depends on an aspect ratio between the distance b and the active length a. For example, an aspect ratio greater than 0.5:1 is considered enough for the seam to be obtained in the conductive material layer 145, considering that in the practice the lateral walls 140 of the isolation regions 57 are never perfectly vertical; different values of the aspect ratio may be possible, depending on the slope of the lateral walls of the isolation regions (in other words, the slope of the lateral walls of the isolation regions and the aspect ratio can be traded off).

Figure 10G:
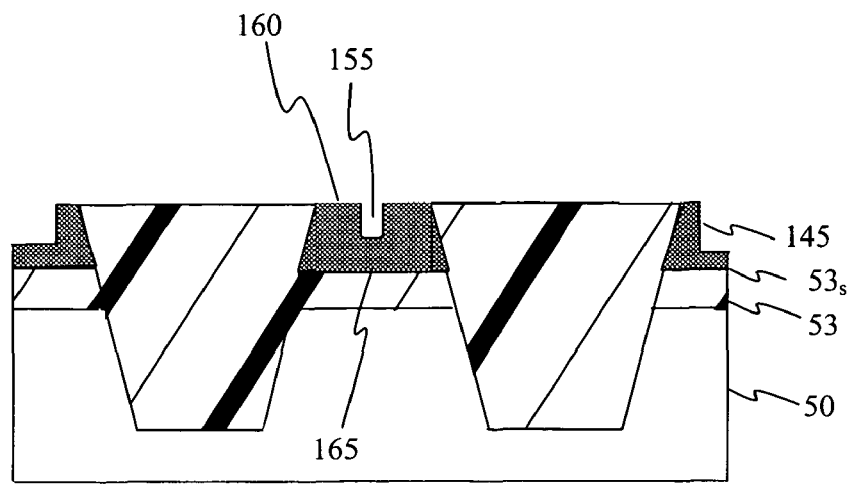

Then, the process proceeds with following steps:

9. The conductive material layer 145 is planarized, for example by a CMP technique, removing the portion of the conductor material layer 145 that is above the surface of the isolation regions 57, and in this way the interstitial space 150 is uncovered. In such a way, a free space 155 is obtained between the isolation regions, having a generic U-shape, defined by side walls 160 and a base wall 165 of the conductive material layer 145 (FIG. 10G).

Figure 10H:
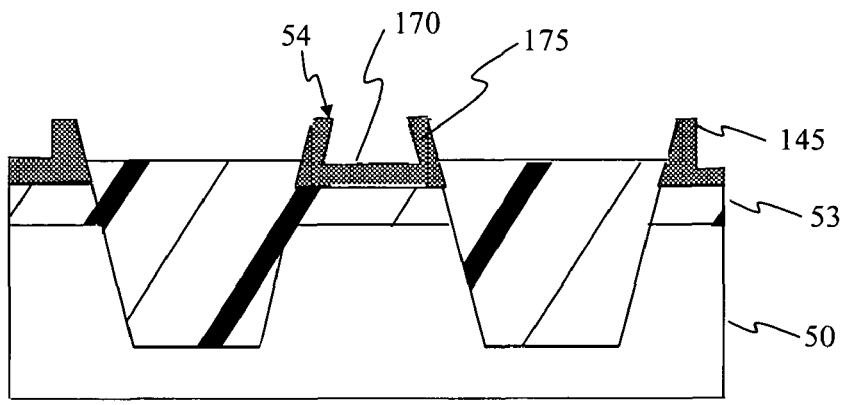

10. The level of the exposed surface of the field oxide forming the isolation regions is then lowered (for example, to a depth from the initial surface ranging from 50 nm to 150 nm) by means of a dry etching process; in this way, a portion of the side walls 160 of the conductive material layer 145 defining the free space 155 protrudes from the surface of the field oxide. At the same time, by tuning the etching selectivity, a relatively small superficial portion of the conductor material layer 145 is also removed so as to widen the free space 155. In such a way, the formation of the floating gate 54 is completed, and the resulting floating gate advantageously has a concave saddle shape, with base wall 170 and side walls 175 (FIG. 10H). For example, the base wall 170 has a thickness ranging from 1 nm to 70 nm, preferably 20 nm, and the side walls 175 project from the base wall of a height equal to at least 5 times the thickness of said base wall (for example, the height is equal to about 105 nm). It should be noted that by means of different etching processes, the interstitial space 150 may be rendered more or less wide depending on the desired application.

Figure 10I:
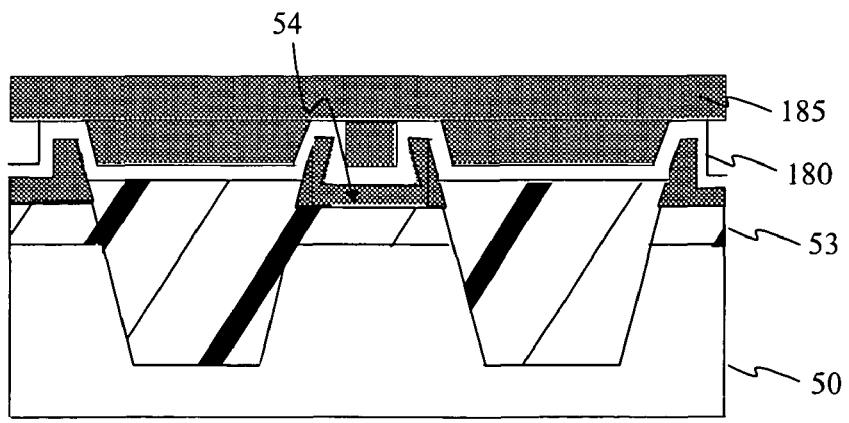

Subsequently, the process continues with the deposition of a dielectric layer 180, (for example, ONO) covering the floating gate 54, and the formation of the control gate by means of a deposition of a polysilicon layer 185 (FIG. 10I).

Subsequently, according to a conventional scheme, the polysilicon layer 185 and the ONO stack of layers 180 are etched. Following per-se known operations leads to the finished memory device.

By the embodiments just described, it is possible to make a floating gate non-volatile semiconductor memory device of very reduced geometric dimensions, typical of memory devices with floating gate self-aligned to STI isolation regions, in which nevertheless the memory cells advantageously possess a capacitive coupling coefficient $\alpha_G$ higher than that obtainable by the prior art, overcoming the limitations and the drawbacks that limit the known devices of this type.

In fact, thanks to the floating-gate shape, the portion of floating-gate surface that faces the control gate is often greater than that obtainable according the prior art.

Accordingly, the capacitive coupling coefficient $\alpha_G$ being directly proportional to the area of the floating gate surface facing the control gate, its value is often greater than that obtainable by prior methods.

Such a higher value of the capacitive coupling coefficient $\alpha_G$ significantly improves the efficiency of the programming and erasing operations of the memory cells, thus overcoming the problems present in memory devices made according to conventional principles.

Advantageously, these embodiments often provide a higher value of the capacitive coupling coefficient $\alpha_G$ without the addition of lithographic phases, which may produce misalignments and dimensional problems.

Besides, the methods according to embodiments of the invention allow making a floating gate non-volatile semiconductor memory device in which the parasitic capacitive coupling between adjacent memory cells advantageously is reduced in comparison to that obtainable according to the prior art.

This advantage is due to the fact that, operating in the way proposed, the floating gate that is obtained, thanks to the peculiar concave, saddle shape, possesses side walls of lower area than the devices made according to the prior art.

In fact, based on the model of a capacitor with plane and parallel plates, the parasitic capacitive coupling between adjacent memory cells, particularly in the direction AA' along which the bit lines extend, is directly proportional to the area of the walls of the floating gates of adjacent cells facing each other.

Since according to embodiments of the invention it is advantageously the thickness of a deposited layer, and not a lithography operation, that defines the thickness of the side walls of the floating gate, one can make the side walls of floating gates of adjacent memory cells of very reduced thickness, if desired thinner than the base wall, thereby forming adjacent memory cells with reduced parasitic capacitive coupling.

This peculiarity is particularly advantageous in the case of NAND flash type floating gate non-volatile semiconductor memory devices, in which the disturbance due to the parasitic capacitive coupling between adjacent memory cells currently represent one of the causes of variation of the threshold voltage in the memory cell matrixes.

Besides, it is particularly useful applying embodiments according to the invention to multilevel flash memory, in which the reduced threshold variation margins between the different programming states make the correct operation of the memory cells particularly critical in the presence of a high parasitic capacitive coupling between adjacent memory cells.

Embodiments according to the invention may, therefore, be very advantageous in the case of NOR or NAND flash type or multilevel floating gate non-volatile semiconductor memory devices, but they can be applied to any semiconductor memory device in which it is necessary to have a wide coupling area between the floating gate and any other electrode.

Naturally, in order to satisfy specific and contingent requirements, a person skilled in the art may apply to the solution described above many modifications and alterations. Particularly, although embodiments of the present invention have been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, the interstitial space may have different shape.

In addition, the depth of the isolation regions may greatly vary.

In any case, the use of alternative processes for realizing the proposed memory cell is possible.

For example, it is possible to use a wet etching for widening the interstitial space.

Moreover, before filling the trenches of the isolation regions with the field oxide layer, a thin layer of silicon oxide may be formed to cover the walls of the trenches.

The above-described memory cells may be incorporated into an Integrated Circuit (IC) such as a memory IC, which may be incorporated into an electronic system such as a computer system.

From the foregoing it will be appreciated that, although specific embodiments of the invention have been described herein for purposes of illustration, various modifications may be made without deviating from the spirit and scope of the invention.

What is claimed is:

1. An integrated circuit, comprising:
a memory cell formed between and self-aligned with adjacent shallow-trench isolation (STI) regions on a substrate, the memory cell including
a source region;
a drain region;
a body region disposed between the source and drain regions;
a first gate insulator disposed over the body region;
a floating gate disposed over and in contact with the first gate insulator, the floating gate being a single element and having a continuous portion comprising a base and a pair of side extensions, the pair of side extensions extending above the base, each side extension having an inner sidewall and an outer sidewall, the inner sidewalls of the side extensions extending towards one another as the side extensions extend away from the base, the adjacent STI regions contacting at least a portion of the outer sidewall of each of the side extensions proximate to the base of the floating gate;
a second gate insulator disposed over the floating gate, directly on the single element comprising the base; and
a control gate disposed over the second gate insulator.

2. The integrated circuit of claim 1, wherein the outer sidewalls of the side extensions extend towards one another and away from the base.

3. The integrated circuit of claim 1, wherein the first gate insulator comprises silicon oxide.

4. The integrated circuit of claim 1, wherein the floating gate comprises doped or non doped polycrystalline silicon.

5. The integrated circuit of claim 1, wherein the floating gate has a thickness ranging from 10 nm to 70 nm.

6. An electronic system, comprising:
an integrated circuit, including
a memory cell formed between and self-aligned with adjacent shallow-trench isolation (STI) regions on a substrate, the memory cell having
a body region disposed between source and drain regions;
a first gate insulator disposed over the body region;
a floating gate disposed over and in contact with the first gate insulator, the floating gate being a single element and having a continuous portion comprising a base and a pair of side extensions, the pair of side extensions extending above the base, each side extension having an inner sidewall and an outer sidewall, the inner sidewalls of the side extensions extending towards one another as the side extensions extend away from the base, the adjacent STI regions contacting at least a portion of the outer sidewall of each of the side extensions proximate to the base of the floating gate;
a second gate insulator disposed over the floating gate, directly on the single element comprising the base; and
a control gate disposed over the second gate insulator.

7. The electronic system of claim 6, wherein the outer sidewalls of the side extensions extend towards one another and away from the base.

8. The electronic system of claim 6, wherein the first gate insulator comprises silicon oxide.

9. The electronic system of claim 6, wherein the floating gate comprises doped or non doped polycrystalline silicon.

10. The electronic system of claim 6, wherein the floating gate has a thickness ranging from 10 nm to 70 nm.

11. A memory cell, comprising:
a source region;
a drain region;
a body region disposed between the source and drain regions;
a first gate insulator disposed over the body region;
a floating gate disposed over and in contact with the first gate insulator, the floating gate being a single element and having a continuous portion comprising a base and a pair of side extensions, the floating gate disposed on the first gate insulator, the pair of side extensions extending above the base, each side extension having an inner sidewall and an outer sidewall, the inner sidewalls of the side extensions extending towards one another as the pair of side extensions extend away from the base, shallow-trench isolation regions formed on either side of the memory cell contacting at least a portion of the outer sidewall of each of the side extensions proximate to the base of the floating gate;

a second gate insulator disposed over the floating gate; and a control gate disposed over the second gate insulator, the pair of side extensions to increase a capacitive coupling between the floating gate and the control gate.

* * * * *